(12) United States Patent
Lien et al.

(10) Patent No.: US 11,462,549 B2
(45) Date of Patent: Oct. 4, 2022

(54) SEMICONDUCTOR DEVICE AND METHOD OF FABRICATING THE SAME

(71) Applicant: Taiwan Semiconductor Manufacturing Co., Ltd., Hsinchu (TW)

(72) Inventors: Chong-De Lien, Taoyuan (TW); Shih-Hao Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 114 days.

(21) Appl. No.: 16/916,150

(22) Filed: Jun. 30, 2020

(65) Prior Publication Data
US 2021/0408010 A1 Dec. 30, 2021

(51) Int. Cl.
| | |
|---|---|
| H01L 27/11 | (2006.01) |
| H01L 29/775 | (2006.01) |
| H01L 29/06 | (2006.01) |
| H01L 21/8238 | (2006.01) |
| H01L 21/02 | (2006.01) |
| H01L 29/78 | (2006.01) |
| H01L 29/66 | (2006.01) |

(52) U.S. Cl.
CPC .... *H01L 27/1104* (2013.01); *H01L 21/02603* (2013.01); *H01L 21/823821* (2013.01); *H01L 29/0673* (2013.01); *H01L 29/66545* (2013.01); *H01L 29/66553* (2013.01); *H01L 29/66795* (2013.01); *H01L 29/775* (2013.01); *H01L 29/7851* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/10879; H01L 27/1104; H01L 27/1211; H01L 29/0653; H01L 29/0665; H01L 29/0669; H01L 29/0673; H01L 29/41791; H01L 29/66439; H01L 29/6653; H01L 29/66545; H01L 29/66553; H01L 29/6656; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

(Continued)

*Primary Examiner* — David C Spalla
(74) *Attorney, Agent, or Firm* — JCIPRNET

(57) ABSTRACT

Provided is a SRAM device including a pull-up device and a pull-down device. The pull-up device includes a plurality of first epitaxial source and drain (S/D) features on a first fin, and a plurality of first residues between the plurality of first epitaxial source and drain (S/D) features and the first fin. The pull-down device includes a plurality of second epitaxial S/D features on a second fin.

20 Claims, 25 Drawing Sheets

(56) References Cited

U.S. PATENT DOCUMENTS

| | | | |
|---|---|---|---|
| 2019/0109052 A1* | 4/2019 | Reznicek | H01L 21/823814 |
| 2019/0287864 A1* | 9/2019 | Cheng | H01L 21/823468 |
| 2019/0341450 A1* | 11/2019 | Lee | H01L 21/823864 |
| 2021/0098304 A1* | 4/2021 | Chang | H01L 29/6653 |

* cited by examiner

SEMICONDUCTOR DEVICE AND METHOD OF FABRICATING THE SAME

BACKGROUND

Static random access memory (SRAM) is commonly used for data storage when the SRAM is supplied with power. To meet the demand in portable electronics and high speed computation, it is desirable to integrate more data storage cells including cross-coupled invertors into a single SRAM chip and to lower power consumption thereof, for example, by replacing conventional transistors with fin field-effect transistors (FinFET) or gate-all-around (GAA) transistors having smaller size and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 4, and 5A to 11A are diagrammatic perspective views of a semiconductor device at other various stages of fabrication in accordance with some embodiments of the present disclosure.

FIGS. 5B to 11B are fragmentary cross-sectional views along the I-I', II-II', III-III', and IV-IV' lines of the semiconductor devices in FIGS. 5A to 11A at other various stages of fabrication in accordance with some embodiments of the present disclosure.

FIGS. 5C to 9C are fragmentary cross-sectional views along the V-V' and VI-VI' lines of the semiconductor devices 200 in FIGS. 5A to 9A at other various stages of fabrication in accordance with some embodiments of the present disclosure of the method 100.

DETAILED DESCRIPTION

Figure 1:
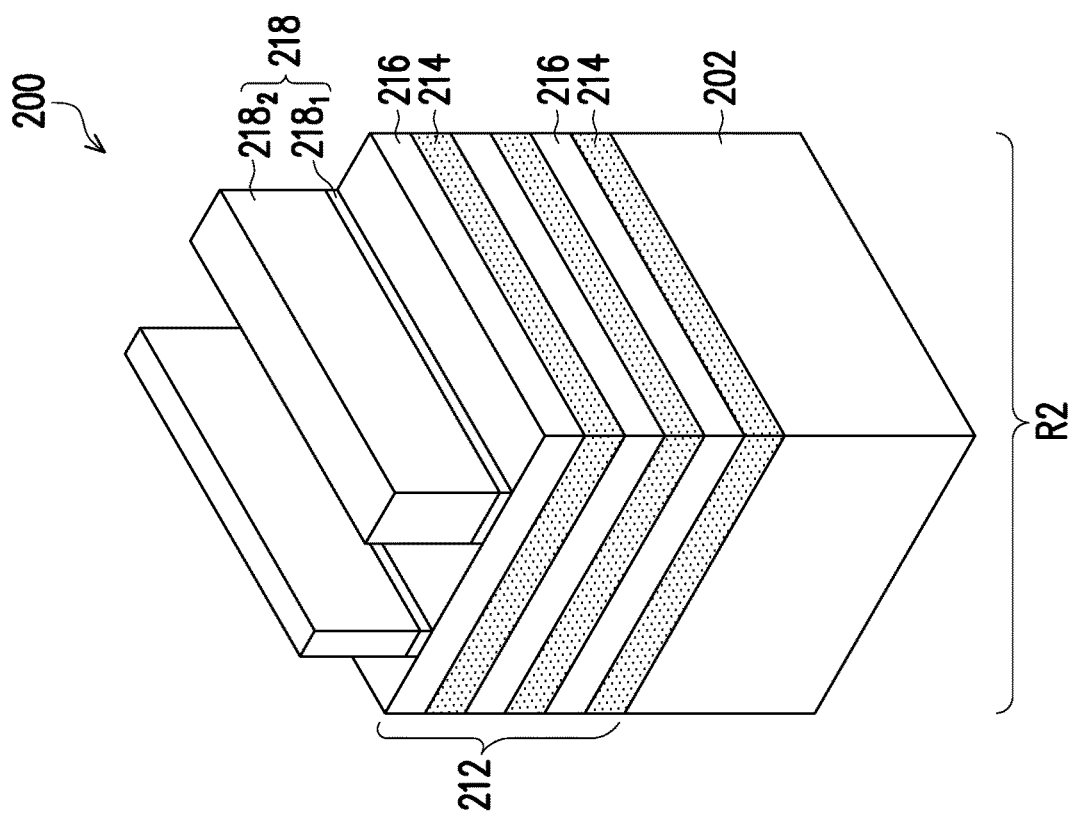
Figure 1:
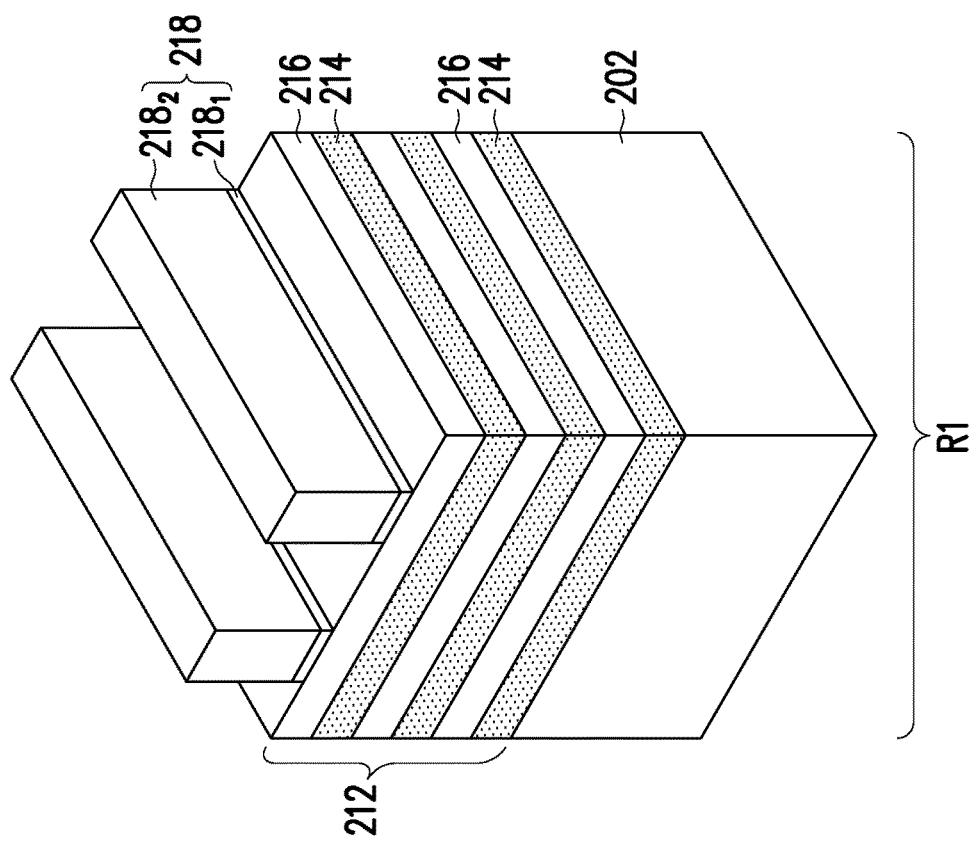

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels. One of ordinary skill may recognize other examples of semiconductor devices that may benefit from aspects of the present disclosure.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 12:
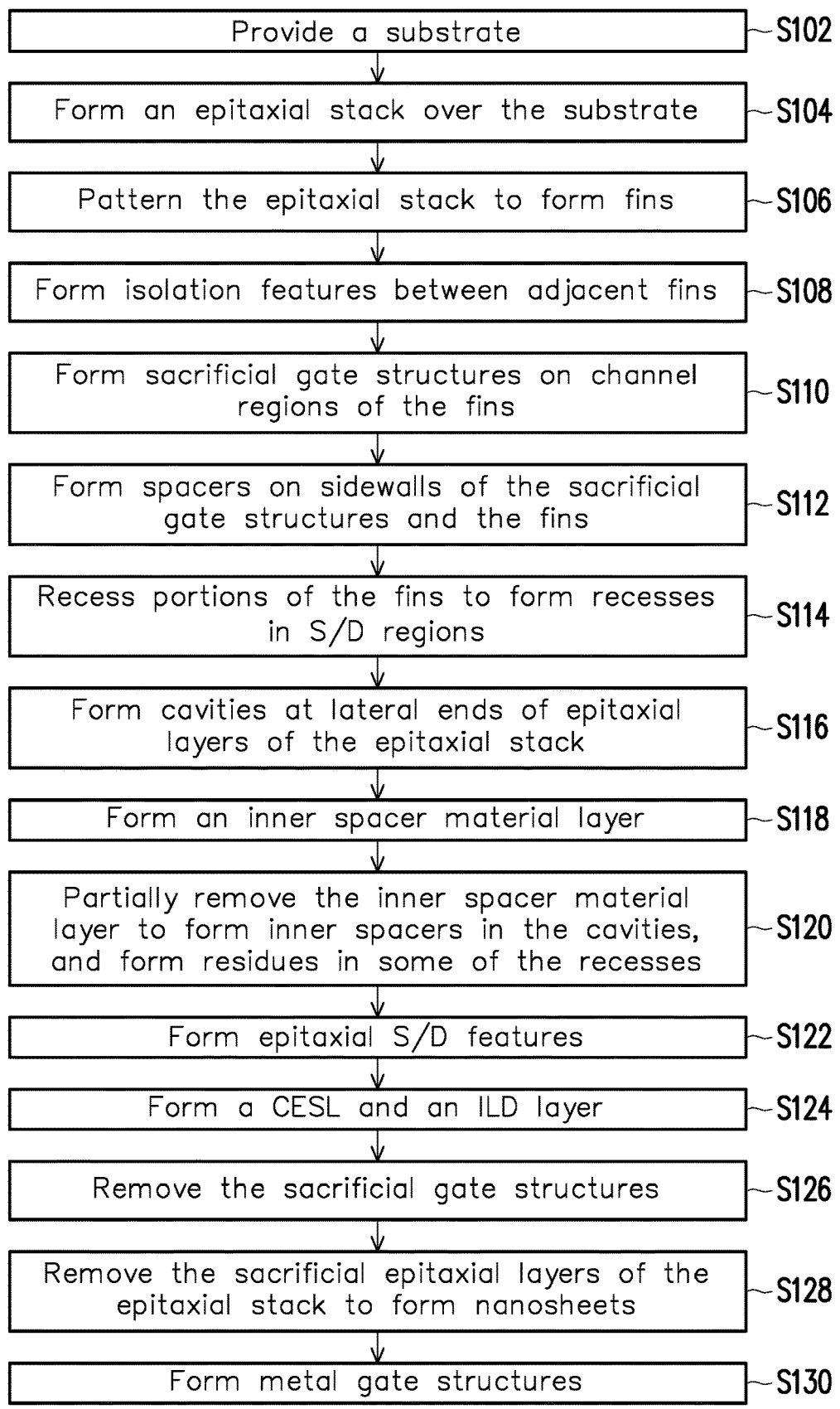
FIG. 12 illustrates a flow chart of a method for forming a semiconductor device according to various aspects of the present disclosure.

FIG. 12 illustrates a flow chart of a method 100 for forming multi-gate devices according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nanosheet" or "semiconductor nanosheet," which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

FIG. 12 will be described below in conjunction with FIGS. 1 to 11C. FIGS. 1 to 4, and 5A to 11A are diagrammatic perspective views of a semiconductor device 200 at other various stages of fabrication in accordance with some embodiments of the present disclosure of the method 100. FIGS. 5B to 11B are fragmentary cross-sectional views along the I-I', II-II', III-III', and IV-IV' lines of the semiconductor devices 200 in FIGS. 5A to 11A at other various stages of fabrication in accordance with some embodiments of the present disclosure of the method 100. FIGS. 5C to 9C are fragmentary cross-sectional views along the V-V', and VI-VI' lines of the semiconductor devices 200 in FIGS. 5A to 9A at other various stages of fabrication in accordance with some embodiments of the present disclosure of the method 100. FIG. 11C are fragmentary cross-sectional views along the VII-VII' line and VIII-VIII' of the semiconductor devices 200 in FIG. 11A at other various stages of fabrication in accordance with some embodiments of the present disclosure of the method 100. The method 100 is merely an example, and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device depicted in FIGS. 1 to 11C and some of the features described below can be replaced, modified, or eliminated in other embodiments of the semiconductor device.

As with the other method embodiments and exemplary devices discussed herein, it is understood that parts of the semiconductor device 200 may be fabricated by a CMOS and static random access memory (SRAM) technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 1 to 11C, as with the remainder of the method and exemplary figures provided in this disclosure, are merely exemplary and are not intended to be limiting beyond what is specifically recited in the claims that follow.

At operation S102, the method 100 (FIG. 12) provides a substrate 202, as shown in FIG. 1. In some embodiments, the substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. For example, different doping profiles (e.g., p-well, n-well) may be formed on the substrate 202 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor.

In the illustrated embodiment, the substrate 202 is made of crystalline Si. The substrate 202 may comprises a region R1 and a region R2. In some embodiments, the region R1 is a logic region, and the region R2 is a SRAM region. In accordance with some embodiments, two transistors (including a p-type transistor and an n-type transistor), or more are included in the logic region, and six transistors (including two p-type transistors and four n-type transistors) are included in the SRAM region. The two p-type transistors in the SRAM region are referred to as transistors or pull-up devices, while the two n-type transistors in the SRAM region are referred to as pull-down transistors or pull-down devices. In addition, the third n-type transistor and the fourth n-type transistor in the SRAM region are referred to as pass-gate (PG) transistors. For clarity, two transistors are illustrated in the region R1, and two transistors are illustrated in the region R2. In some embodiments, the two transistors illustrated in the region R1 includes an p-type transistor and a n-type transistor, and one of the two transistors illustrated in the region R2 is a p-type transistor as a pull-up transistor, and the other one of the two transistors illustrated in the region R2 is an n-type transistor as a pull-down transistor or a n-type pass-gate (PG) transistor.

At operation S104, the method 100 (FIG. 12) forms one or more epitaxial layers over the substrate 202 in the regions R1 and R2, as shown in FIG. 6. In some embodiments, an epitaxial stack 212 is formed over the substrate 202. The epitaxial stack 212 includes epitaxial layers 214 of a first composition interposed by epitaxial layers 216 of a second composition. The first and second composition may be different. In an embodiment, the epitaxial layers 214 are SiGe and the epitaxial layers 216 are silicon. However, other embodiments are possible including those that provide for a first composition and a second composition having different oxidation rates and/or etch selectivity. In some embodiments, the epitaxial layer 214 includes SiGe and where the epitaxial layer 216 includes silicon, the silicon oxidation rate is less than the SiGe oxidation rate. It is noted that three (3) layers of epitaxial layers 214 and three (3) layers of epitaxial layers 216 are illustrated in FIG. 1, which is for illustrative purposes only and not intended to be limiting beyond what is specifically recited in the claims. It can be appreciated that any number of epitaxial layers may be formed in the epitaxial stack 212; the number of layers depending on the desired number of channels regions for the GAA device 200. In some embodiments, the number of epitaxial layers 216 is between 2 and 10, such as 6 or 7.

In some embodiments, the epitaxial layer 214 has a thickness ranging from about 5 nm to about 15 nm. The epitaxial layers 214 may be substantially uniform in thickness. In some embodiments, the epitaxial layer 216 has a thickness ranging from about 5 nm to about 15 nm. In some embodiments, the epitaxial layers 216 of the stack are substantially uniform in thickness. As described in more detail below, the epitaxial layer 216 may serve as channel region(s) for a subsequently-formed multi-gate device and its thickness chosen based on device performance considerations. The epitaxial layer 214 may serve to define a gap between adjacent channel region(s) for a subsequently-formed multi-gate device and its thickness chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 216 include the same material as the substrate 202. In some embodiments, the epitaxially grown layers 214 and 216 include a different material than the substrate 202. As stated above, in at least some examples, the epitaxial layer 214 includes an epitaxially grown $Si_{1-x}Ge_x$ layer (e.g., x is about 10~55%) and the epitaxial layer 216 includes an epitaxially grown silicon (Si) layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation, etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. In some embodiment, the bottom layer and the top layer of the epitaxial stack 212 are SiGe layers (not shown). In alternative embodiments, the bottom layer of the epitaxial stack 212 is a Si layer and the top layer of the epitaxial stack 212 is a SiGe layer (not shown).

Figure 2:
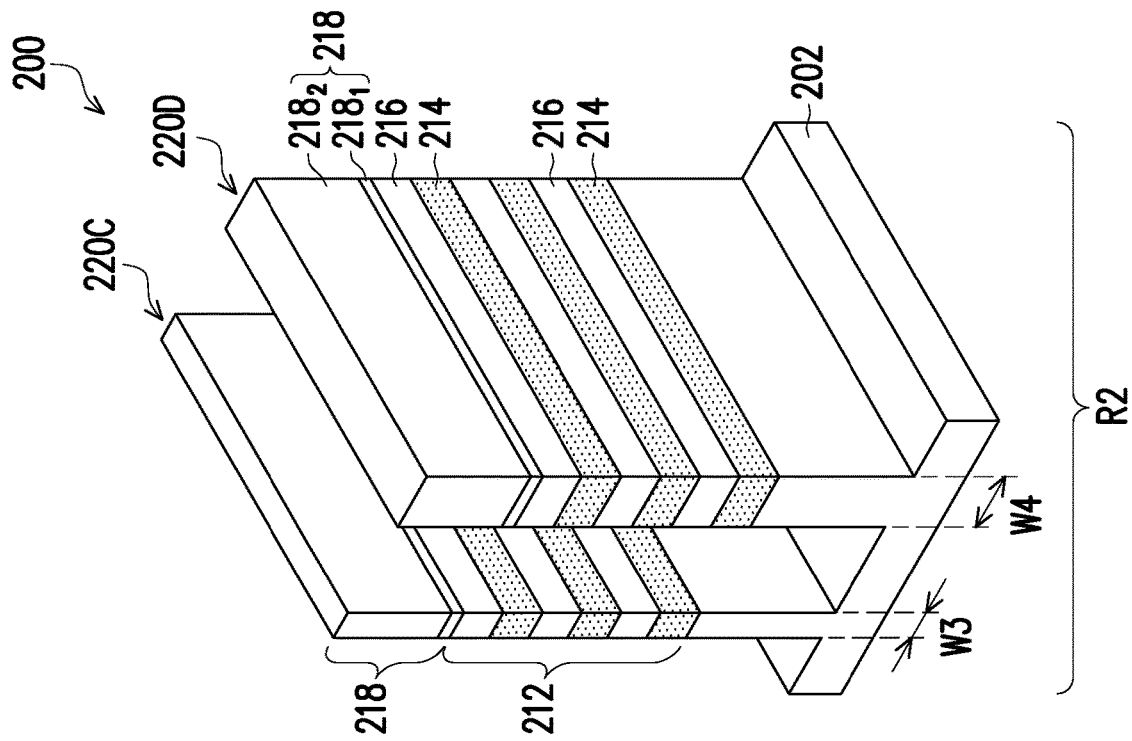
Figure 2:
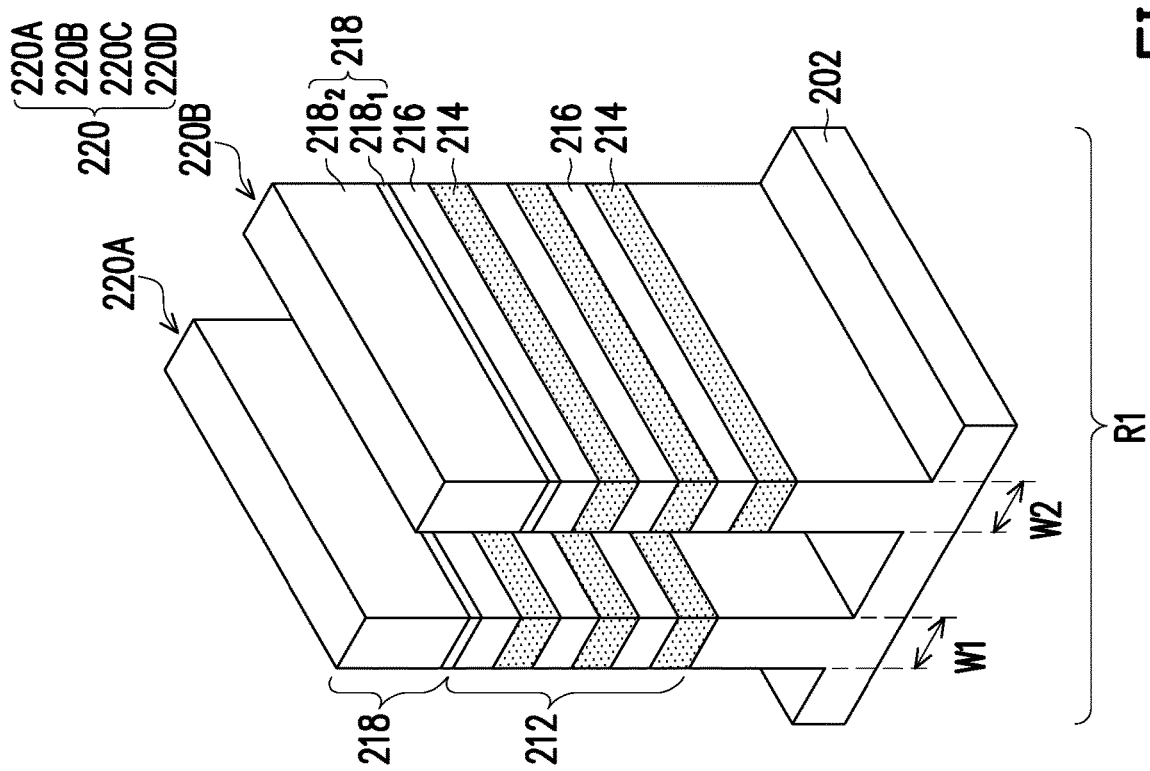

At operation S106, the method 100 (FIG. 12) patterns the epitaxial stack 212 to form semiconductor fins 220 (also referred to as fins 220), as shown in FIG. 2. In some embodiments, the operation S106 includes forming a mask layer 218 over the epitaxial stack 212, as shown in FIG. 1. The mask layer 218 includes a first mask layer $218_1$ and a second mask layer $218_2$. The first mask layer $218_1$ is a pad oxide layer made of a silicon oxide, which may be formed by a thermal oxidation. The second mask layer $218_2$ is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 218 is patterned into a mask pattern by using patterning operations including photolithography and etching. Operation S106 subsequently patterns the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into the fins 220 with trenches between adjacent fins 220. The fins 220 may include fins 220A and 220B formed in the region R1, and fins 220C and 220D formed in the region R2. But the number of the fins is not limited to four, and may be more than four.

In various embodiments, each of the fins 220 includes an upper portion of the interleaved epitaxial layers 214 and 216, and a bottom portion protruding from the substrate 202. Each of the fins 220 protrudes upwardly in the z-direction from the substrate 202 and extends lengthwise in the y-direction. Sidewalls of the fins 220 may be straight or inclined (not shown). In FIG. 2, the fins 220A and 220B, or fins 220C and 220D are spaced apart along the x-direction. The fins 220A, 220B, 220C, and 220D may have a same width or different widths. In some embodiments, the fin 220C has a width W3 less than a width W1 of the fin 220A, a width W2 of the fin 220B and a width W3 of the fin 220C. In some embodiments, the widths W1, W2 and W4 have a same width, and a ratio of the width W1, W2, or W4 to the width W3 is in a range from 3 to 5.

Figure 3:
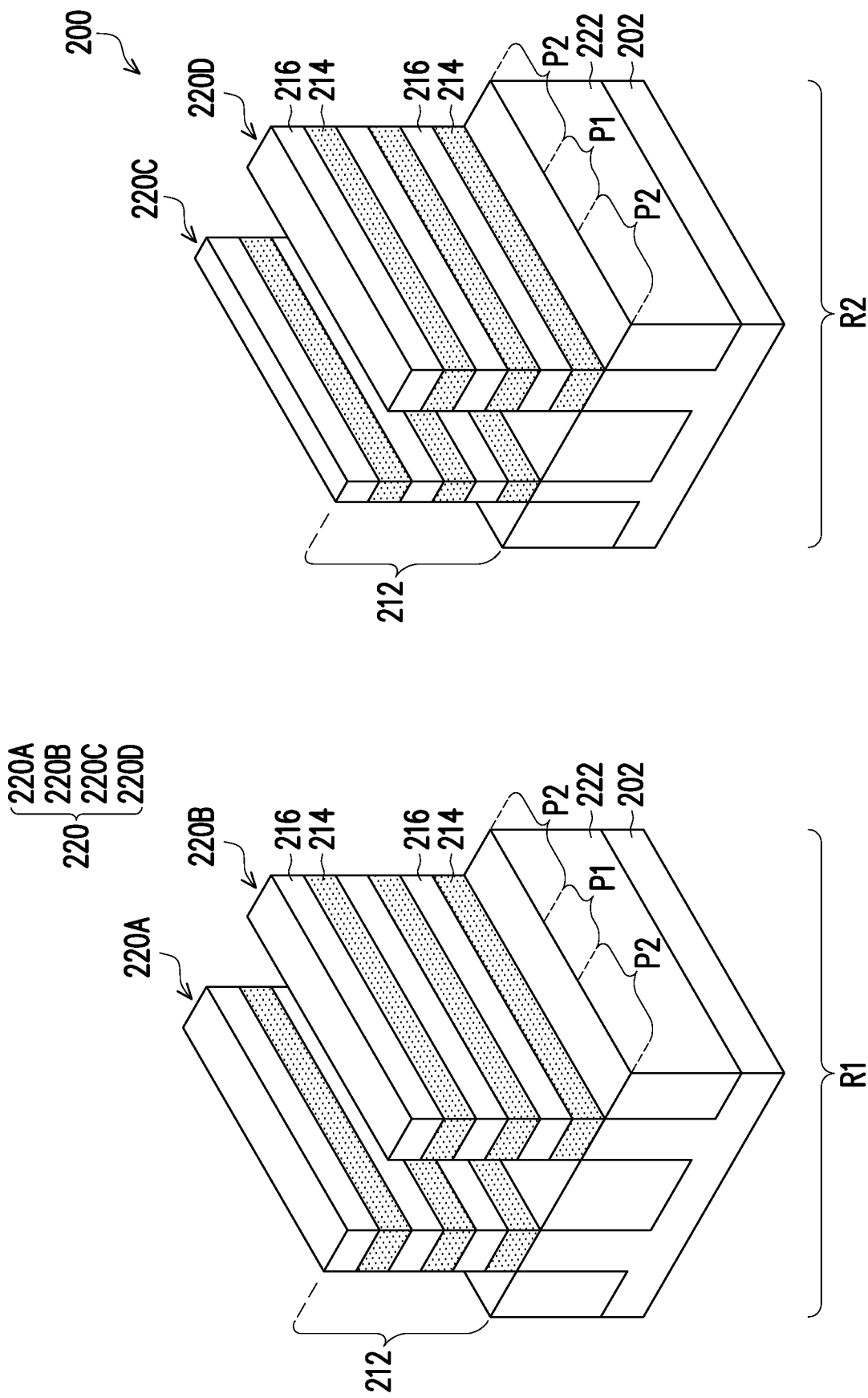

At operation S108, the method 100 (FIG. 12) forms shallow trench isolation (STI) features (also denoted as STI features) 222 in trenches between adjacent fins 220 with a dielectric layer as shown in FIG. 3. The STI features 222 may be formed by first filling the trenches between adjacent fins 220 with a dielectric material layer (not shown) to cover top surfaces and sidewalls of the fins 220. The dielectric material layer may include one or more dielectric materials. Suitable dielectric materials for the dielectric layer may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques. The dielectric material layer is then planarized by using, for example, CMP, until top surfaces of the mask layer 218 are revealed, and the dielectric material layer is recessed to form the shallow trench isolation (STI) features (also denoted as STI features) 222, as shown in FIG. 3. In the illustrated embodiment, the STI features 222 are formed on the substrate 202. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220. The mask layer 218 (shown in FIG. 2) may also be removed before, during, and/or after the recessing of the isolation features 222. In some embodiments, the mask layer 218 is removed by the CMP process performed prior to the recessing of the isolation features 222. In some embodiments, the mask layer 218 is removed by an etchant used to recess the isolation features 222.

Figure 4:
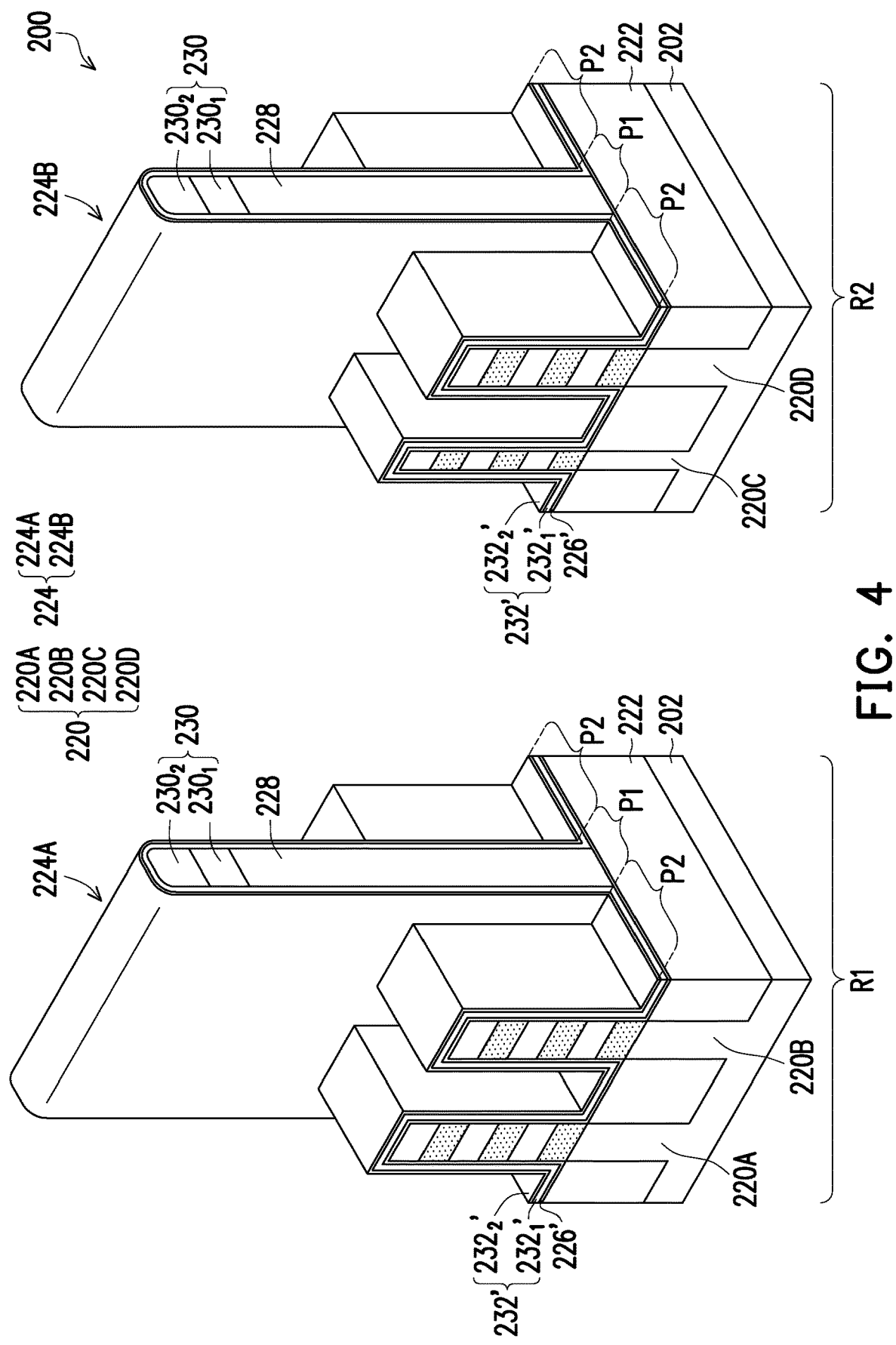
Figure 5A:
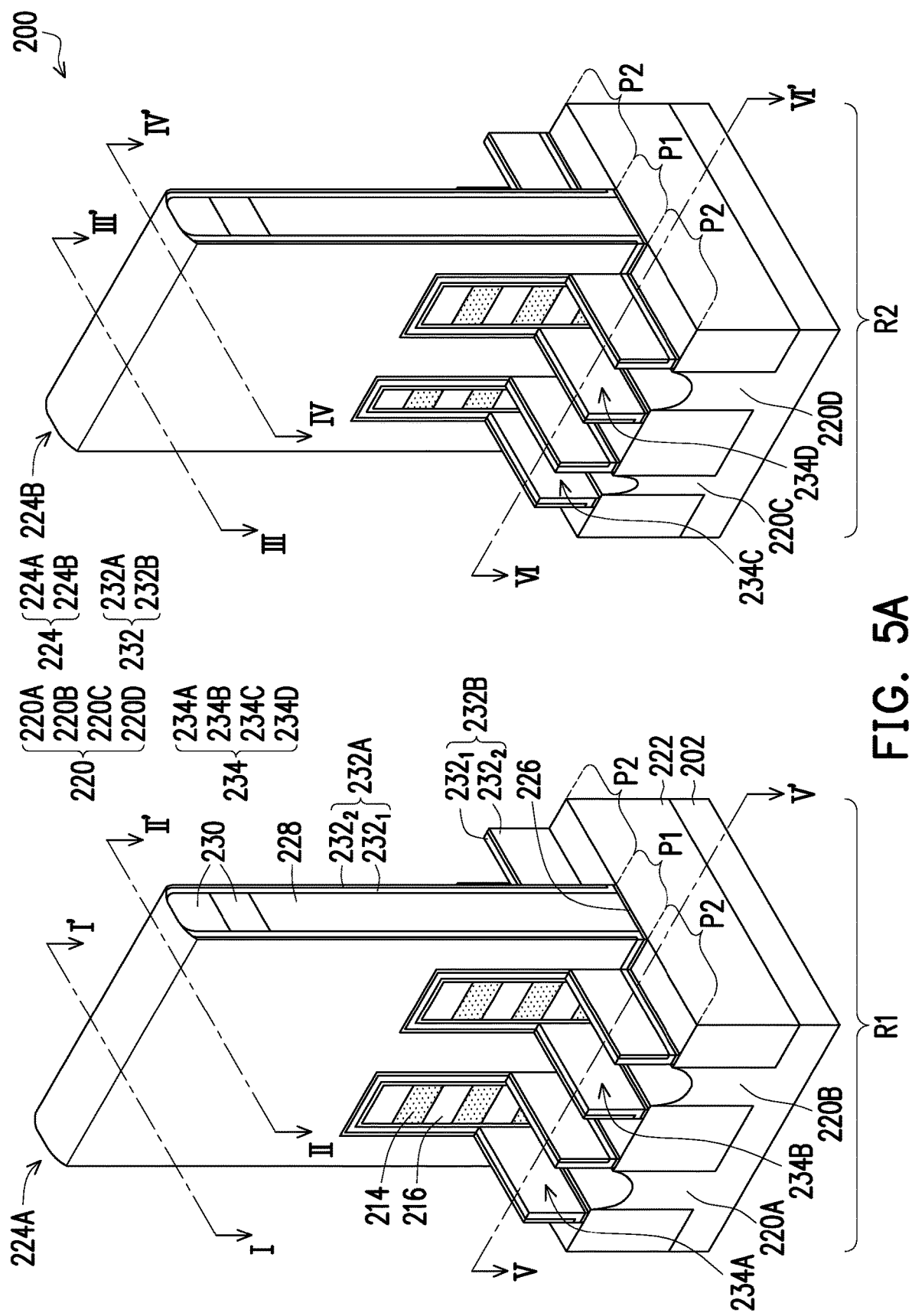
Figure 5B:
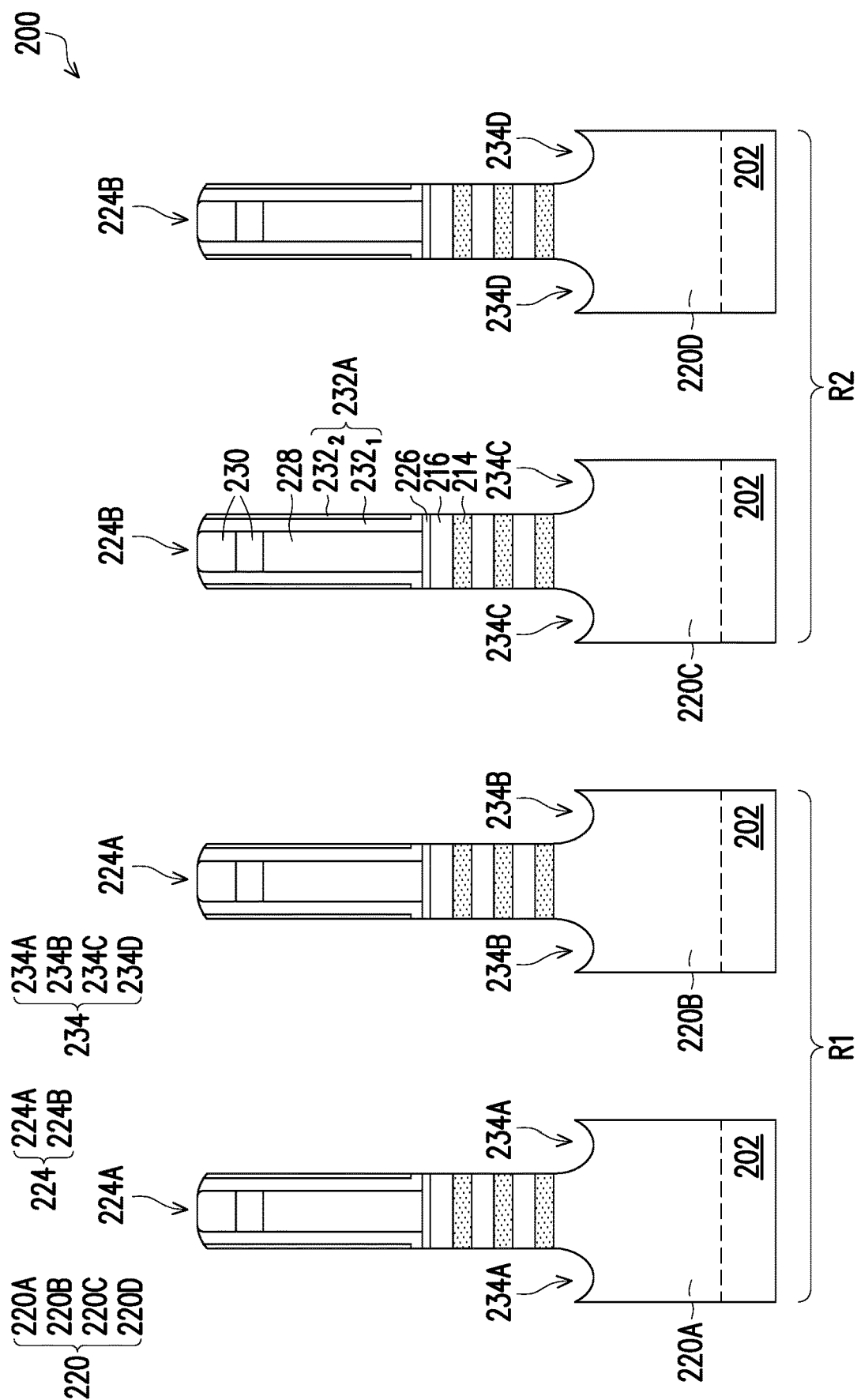

At operation S110, the method 100 (FIG. 12) forms sacrificial (dummy) gate structures 224, as shown in FIGS. 4, 5A and 5B. The sacrificial gate structures 224 are formed over portions P1 of the fins 220 which are to be channel regions. The sacrificial gate structures 224 may include a sacrificial gate structure 224A formed over the portions P1 of the fins 220A and 220B in the region R1, and a sacrificial gate structure 224B formed over the portions P1 of the fins 220C and 220D in the region R2. The sacrificial gate structures 224 define the channel regions of the GAA devices. Each of the sacrificial gate structures 224 includes a sacrificial gate dielectric layer 226 and a sacrificial gate electrode layer 228 over the sacrificial gate dielectric layer 226.

The sacrificial gate structures 224 are formed by first blanket depositing the sacrificial gate dielectric layer 226' over the fins 220. A sacrificial gate electrode layer (not shown) is then blanket deposited on the sacrificial gate dielectric layer 226' and over the fins 220. The sacrificial gate dielectric layer 226' includes silicon oxide, silicon nitride, or a combination thereof. The thickness of the sacrificial gate electrode layer 228 is in a range from about 100 nm to about 200 nm in some embodiments. The sacrificial gate electrode layer includes silicon such as polycrystalline silicon or amorphous silicon. The thickness of the sacrificial gate dielectric layer' is in a range from about 1 nm to about 5 nm in some embodiments. In some embodiments, the sacrificial gate electrode layer is subjected to a planarization operation. The sacrificial gate dielectric layer 226' and the sacrificial gate electrode layer are deposited using CVD, including LPCVD and PECVD, PVD, ALD, or other suitable process. A mask layer 230 is formed over the sacrificial gate electrode layer. The mask layer 230 may include a mask layer 230₁ such as silicon oxide and a mask layer 230₂ such as silicon nitride. Subsequently, a patterning operation is performed on the mask layer 230, the sacrificial gate electrode layers and the sacrificial gate dielectric layer 226' are patterned into the sacrificial gate structures 224. The sacrificial gate dielectric layer 226' may be patterned during etching the spacer material 232' (shown in FIGS. 4 and 5A). The fins 220 are partially exposed on opposite sides of the sacrificial gate structures 224, thereby defining source/drain (S/D) regions. In this disclosure, a source and a drain are interchangeably used and the structures thereof are substantially the same.

Figure 6A:
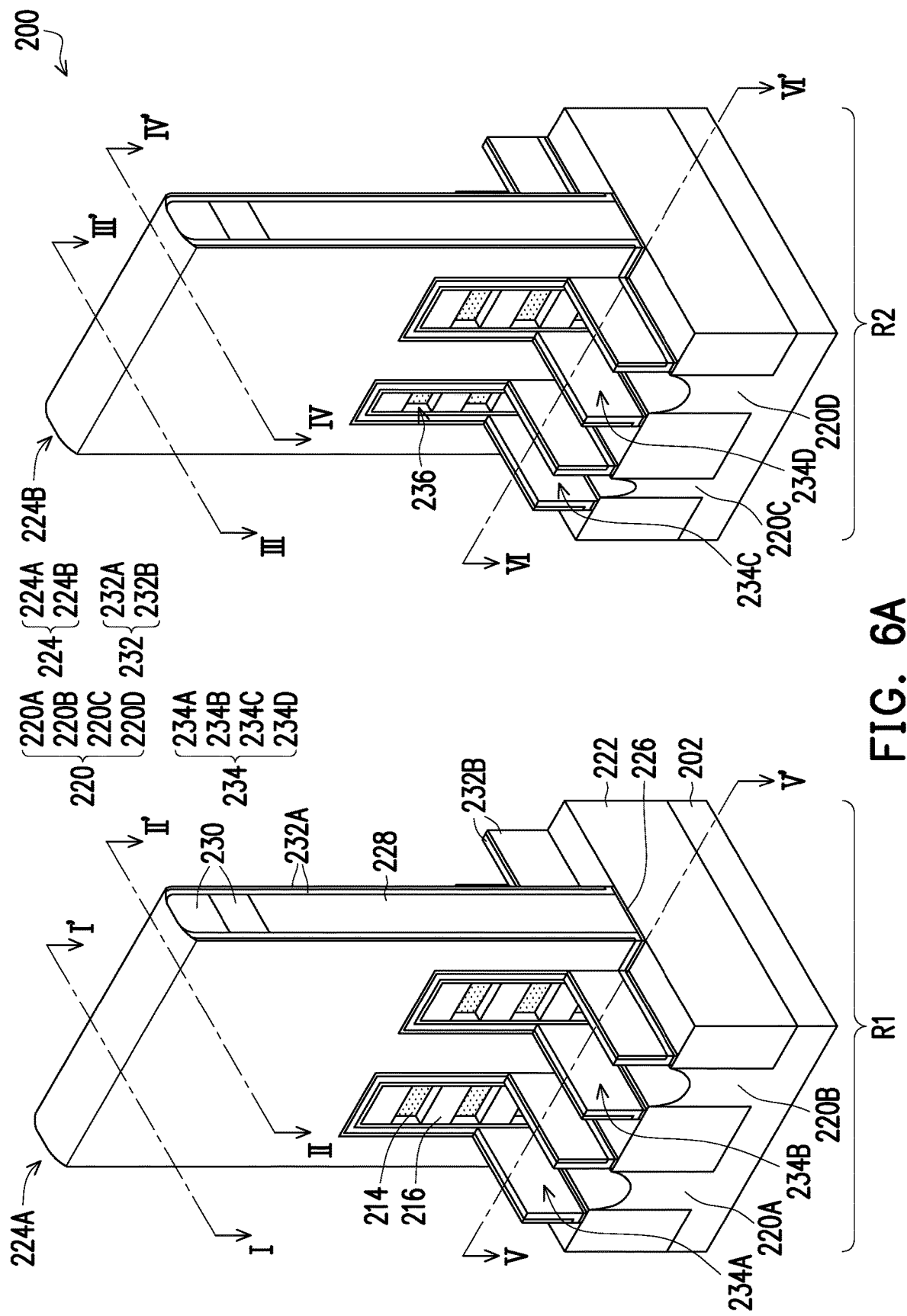
Figure 6B:
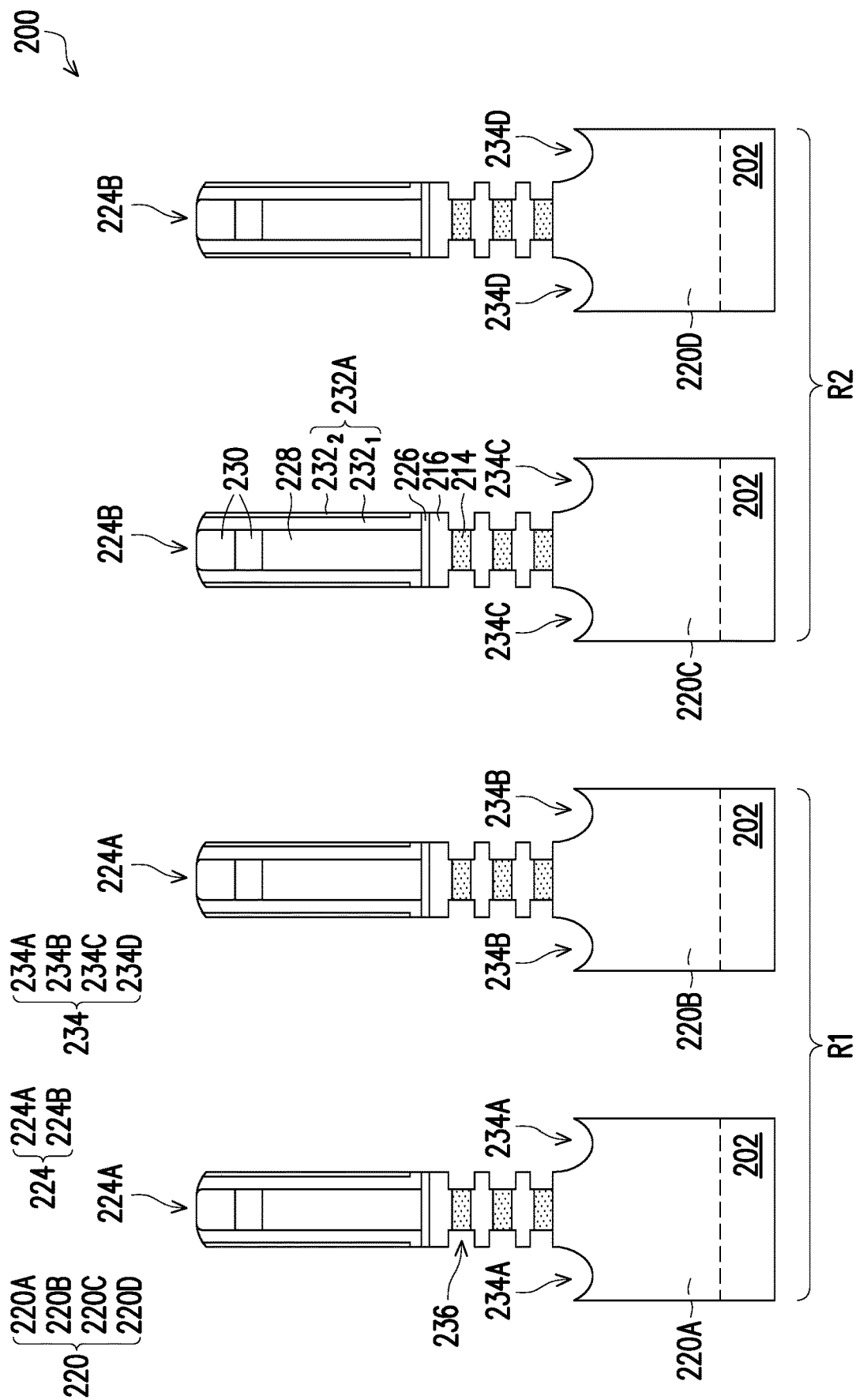
Figure 6C:
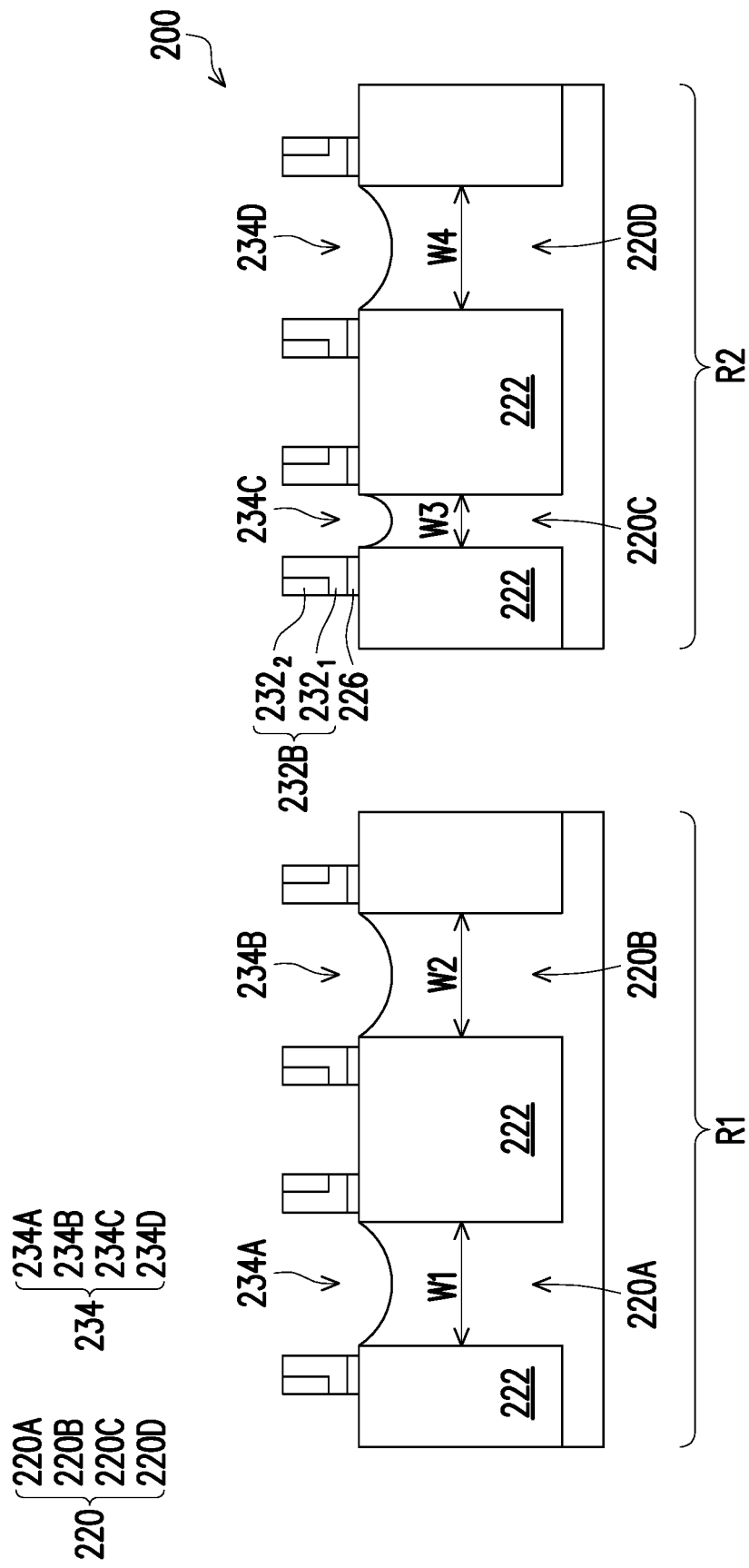

At operation S112, the method 100 (FIG. 12) forms spacers 232 on sidewalls of the sacrificial gate structures 224 and sidewalls of the fins 220 by depositing spacer materials and followed by an etching, as shown in FIGS. 5A, 5B, 6A, 6B, and 6C, where FIG. 6B are cross-sectional views along I-I', II-II', III-III' and IV-IV' lines of the devices 200 in FIG. 6A, and FIG. 6C are cross-sectional views along V-V', and VI-VI' lines of the devices 200 in FIG. 6A. In some embodiments, the spacers 232 include gate sidewall spacers 232A on the sidewalls of the sacrificial gate structure 224, and fin sidewall spacers 232B on the sidewalls of the fins 220. The spacers 232 may include spacer material such as silicon oxide, silicon nitride, silicon carbide, silicon oxynitride, SiCN films, silicon oxycarbide, SiOCN films, and/or combinations thereof. In some embodiments, each of the spacers 232 include multiple layers, such as a liner layer 232₁ and a main spacer wall 232₂ on a sidewall of the liner layer 232₁.

By way of example, the spacers 232 may be formed by depositing spacer material 232' (shown in FIG. 4) including a liner material layer 232i' and a dielectric material layer 232₂' over the sacrificial gate structure 224 using processes such as, a subatmospheric CVD (SACVD) process, a flowable CVD process, an ALD process, a PVD process, or other suitable process respectively. The deposition of the liner material layer and the dielectric material layer are followed by an etching-back (e.g., anisotropically) process to expose portions P2 of the fins 220 adjacent to and not covered by the sacrificial gate structure 224 (e.g., S/D regions), as shown in FIGS. 5A and 5B. The liner material layer and the dielectric material layer may remain on the sidewalls of the sacrificial gate structure 224 as the gate sidewall spacers 232A, and on the sidewalls of the fins as the fin sidewall spacers 232B. In some embodiments, the etching-back process may include a wet etch process, a dry etch process, a multiple-step etch process, and/or a combination thereof. The spacers 232 may have a thickness ranging from about 5 nm to about 20 nm.

Figure 5C:
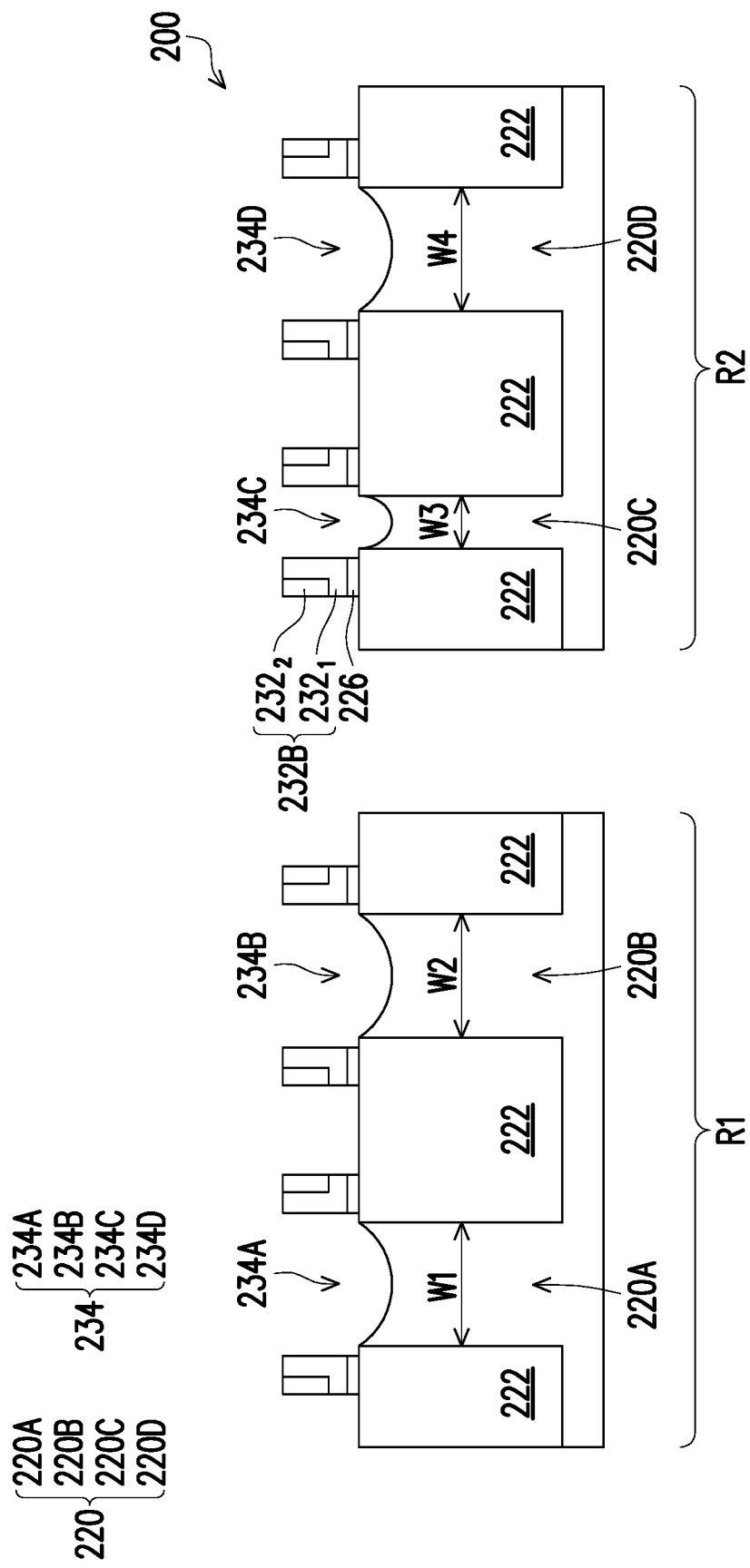

At operation S114, the method 100 (FIG. 12) recesses the portions P2 of the fins 220 not covered by the sacrificial gate structures 224 to form recesses 234 in the S/D regions as shown in FIGS. 5A, 5B and 5C, where FIG. 5B is a cross-sectional view along I-I', II-II', III-III' and IV-IV' lines of the GAA device 200 in FIG. 5A, and FIG. 5C is a cross-sectional view along V-V', and VI-VI' lines of the GAA device 200 in FIG. 5A. The stacked epitaxial layers 214 and 216 are etched down at the S/D regions. In many embodiments, the operation S116 forms the recesses 234 by a suitable etching process, such as a dry etching process, a wet etching process, or a combination thereof. The recesses 234 comprises recesses 234A in the fin 220A and recesses 234B in the fin 220B in the region RE and recesses 234C in the fin 220C, and recesses 234D in the fin 220D in the region R2. Since the width W3 of the fin 220C is less than the widths W1, W2, and W3 of the fin 220A, 220B, and 220D, the recesses 234C has the widths W3 is less than the widths W1, W2, and W3 of the recesses 220A, 220B, and 220D.

At operation S116, the method 100 (FIG. 12) forms cavities 236 at the lateral ends of the epitaxial layers 214 in the y-direction, thereby forming cavities 236, as shown in FIGS. 6A, and 6B, where FIG. 6B is a cross-sectional view along I-I', II-II', III-III' and IV-IV' lines of the GAA device 200 in FIG. 6A, and FIG. 6C is a cross-sectional view along V-V', and VI-VI' lines of the GAA device 200 in FIG. 6A. The amount of etching of the epitaxial layers 214 is in a range from about 1 nm to about 4 nm in some embodiments. The epitaxial layers 214 may be selectively etched by using a wet etchant such as, but not limited to, ammonium hydroxide (NH₄OH), tetramethylammonium hydroxide (TMAH), ethylenediamine pyrocatechol (EDP), potassium hydroxide (KOH), HF, O₃, H₂O₂, or HCl solutions. Alternatively, the operation S116 may first selectively oxidize lateral ends of the epitaxial layers 214 that are exposed in the recesses 234 to increase the etch selectivity between the epitaxial layers 214 and 216. In some examples, the oxidation process may be performed by exposing the GAA device 200 to a wet oxidation process, a dry oxidation process, or a combination thereof.

Figure 7A:
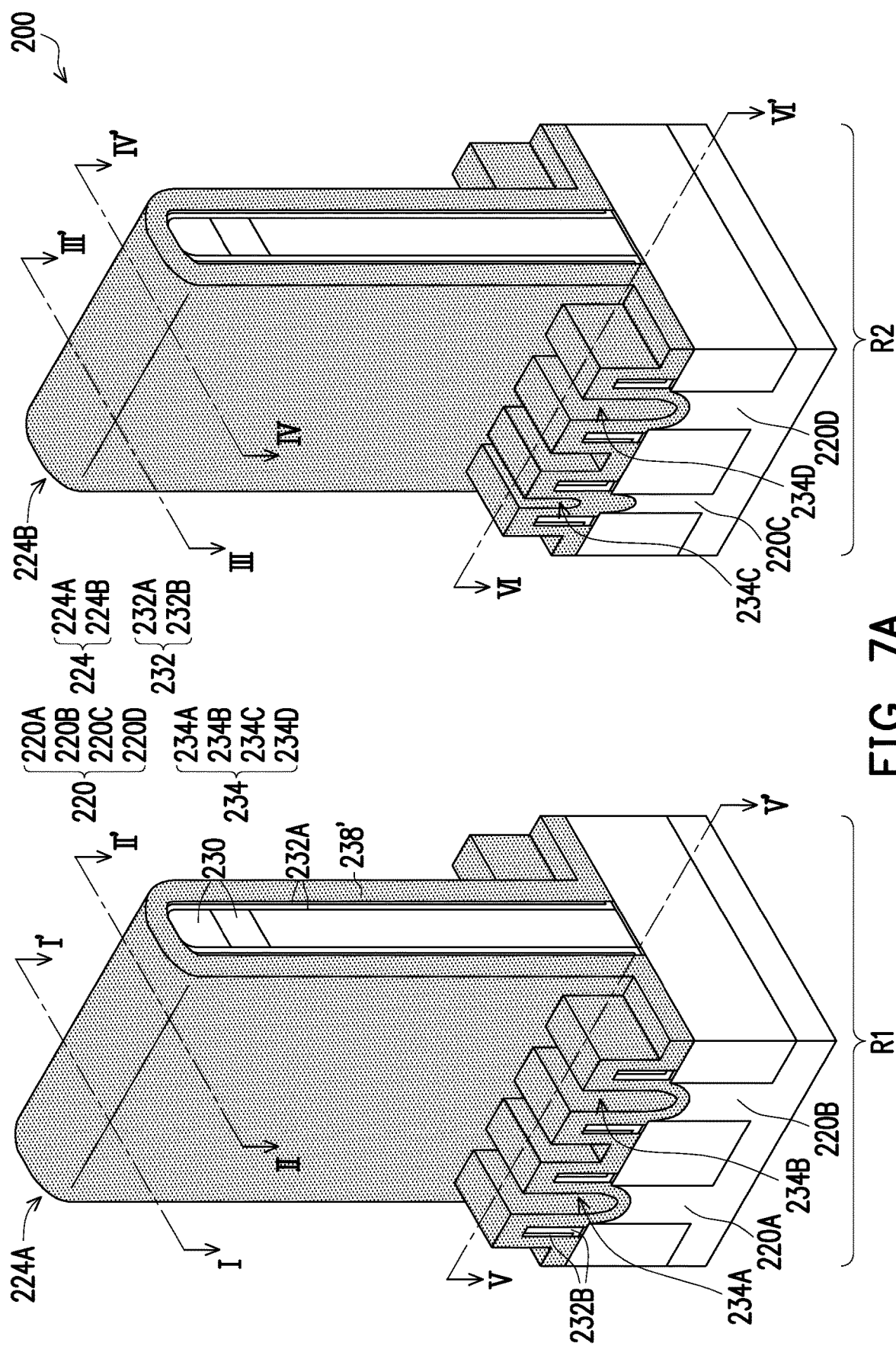
Figure 7B:
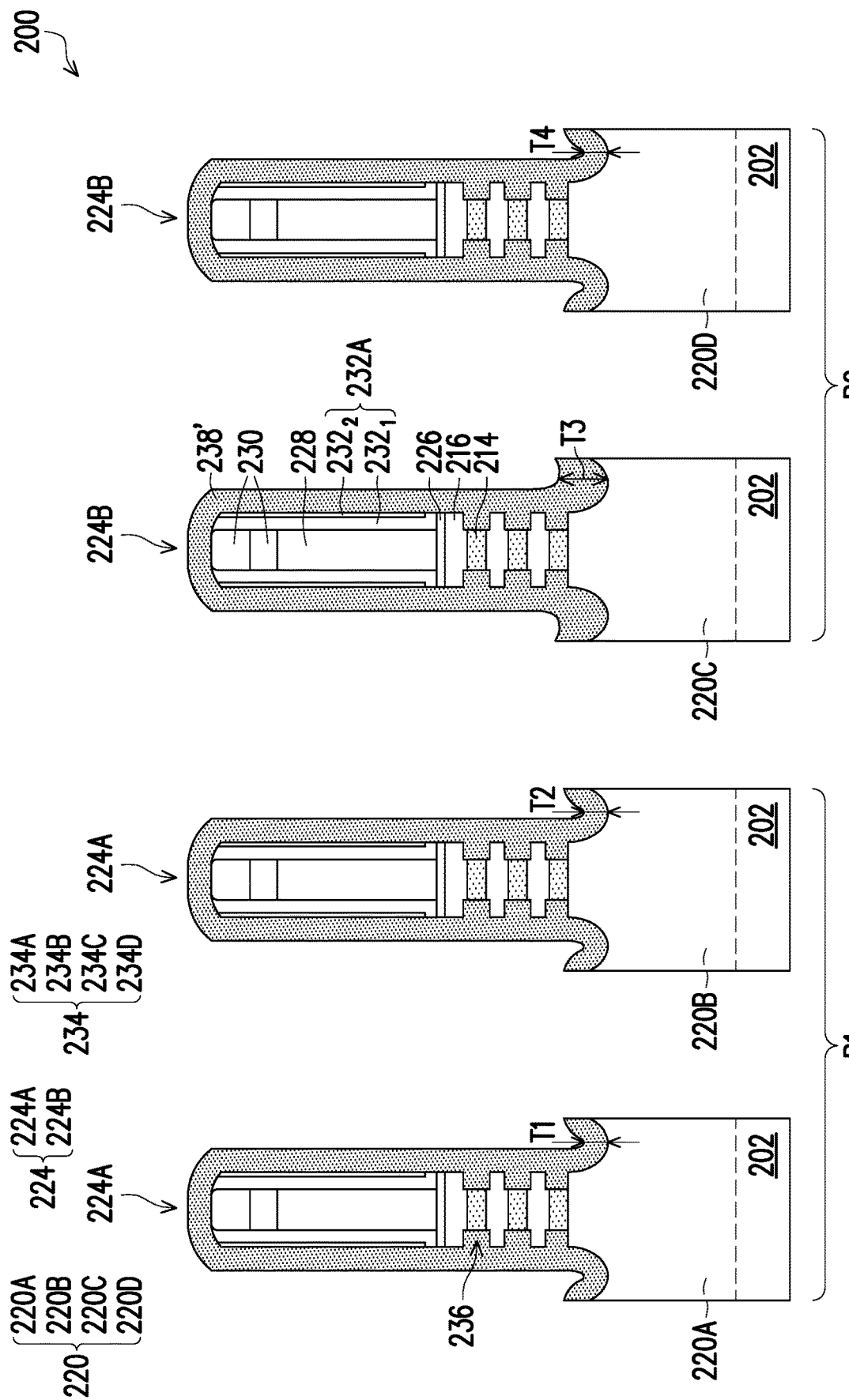
Figure 7C:
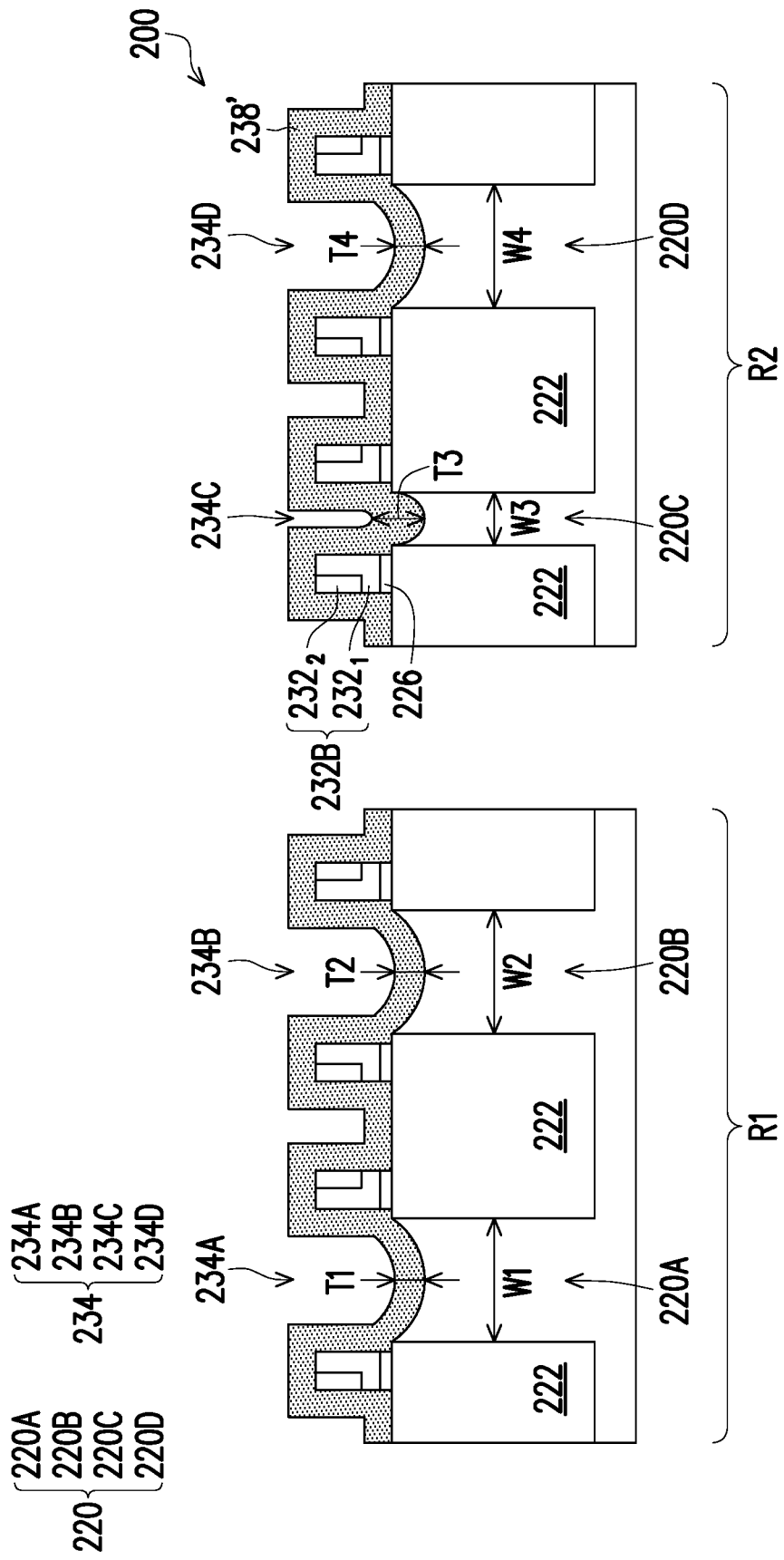

Subsequently, operation S118 forms an inner spacer material layer 238' on the lateral ends of the epitaxial layer 214, on the epitaxial layers 216 and in the cavities 236 and the recesses 234, as shown in FIGS. 7A, 7B and 7C, where FIG. 7B is a cross-sectional view along I-I', II-II', III-III' and IV-IV' lines of the GAA device 200 in FIG. 7A, and FIG. 7C is a cross-sectional view along V-V', and VI-VI' lines of the GAA device 200 in FIG. 7A. The inner spacer material layer 238' may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238' may be formed by ALD or any other suitable method. By forming the inner spacer material layer 238', the size of the cavity 234 is reduced or the cavity 234 is completely filled. The inner spacer material layer 238' may have a thickness ranging from about 4 nm to about 6 nm, for example. Since the widths W3 of the recesses 234C is less than the widths W1 of the recesses 234A, the widths W2 of the recesses 234B, and the widths W4 of the recesses 234D, portions of the inner spacer material layer 238' on sidewalls of the recesses 234C are merged so that the inner spacer material layer 238' in the recesses 234C have thicknesses T3 larger than thicknesses T1 of the inner spacer material layer 238' in the recesses 234A, thicknesses T2 of the inner spacer material layer 238' in the recesses 234B, or thicknesses T4 of the inner spacer material layer 238' in the recesses 234D.

Figure 8A:
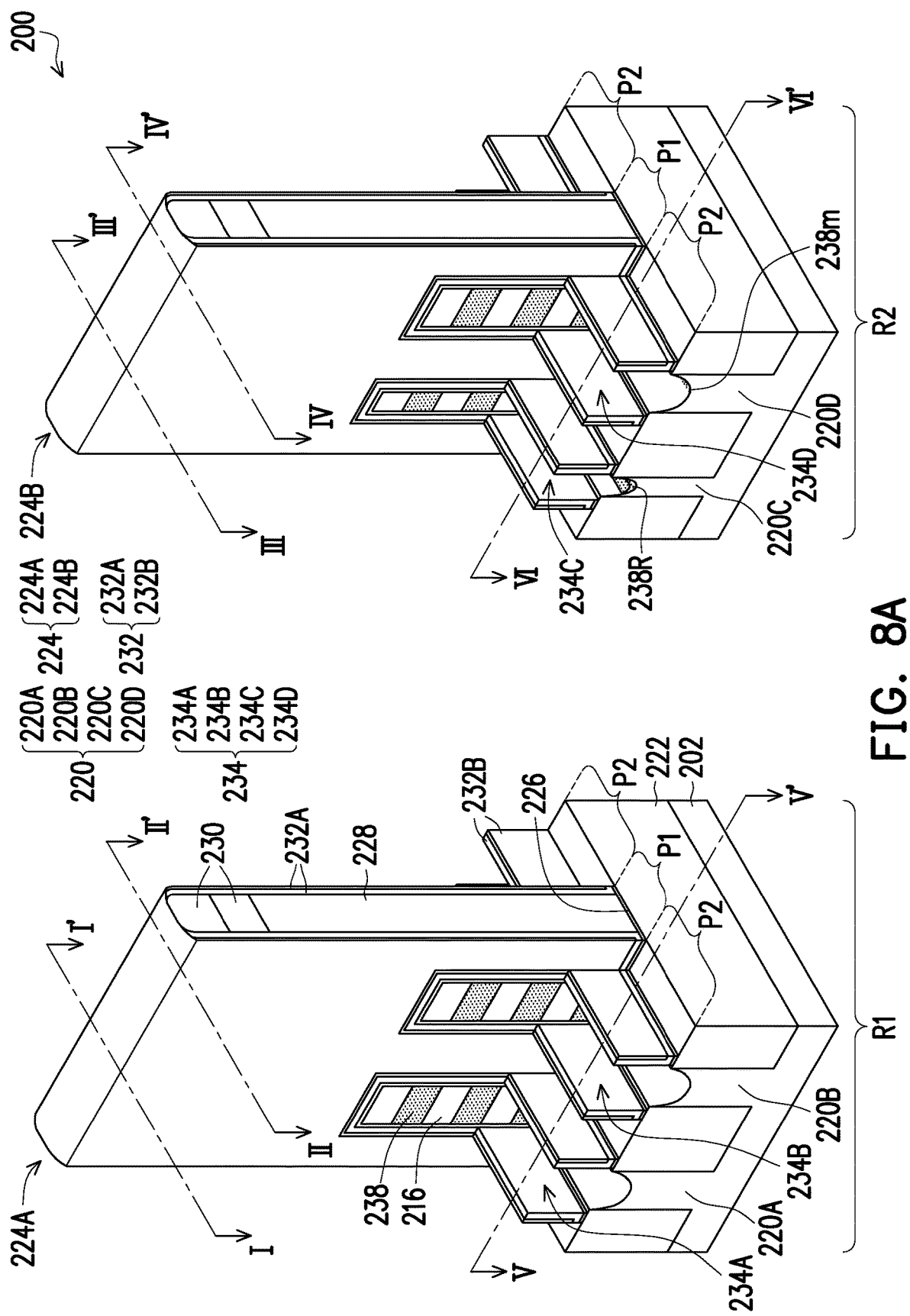
Figure 8B:
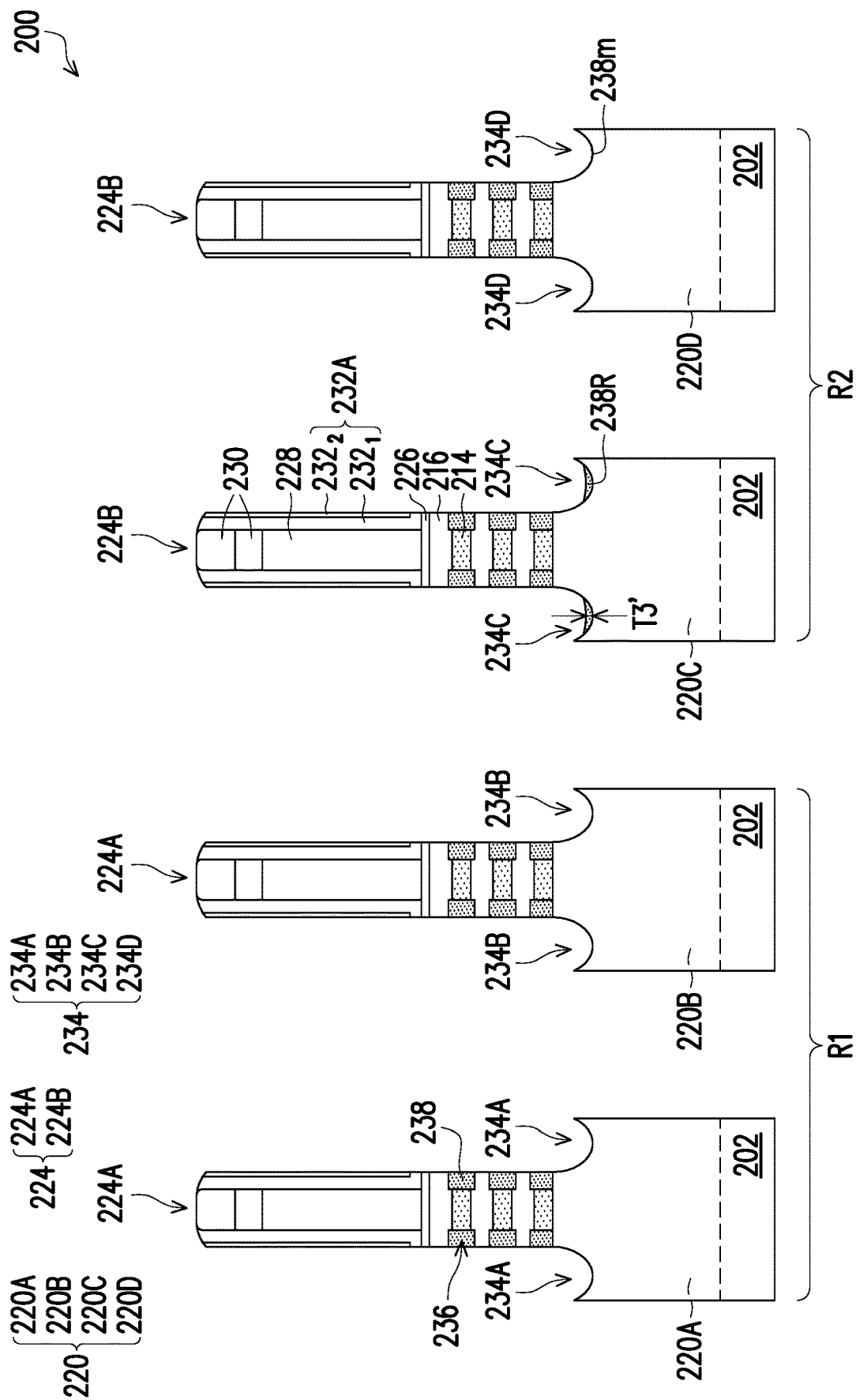
Figure 8C:
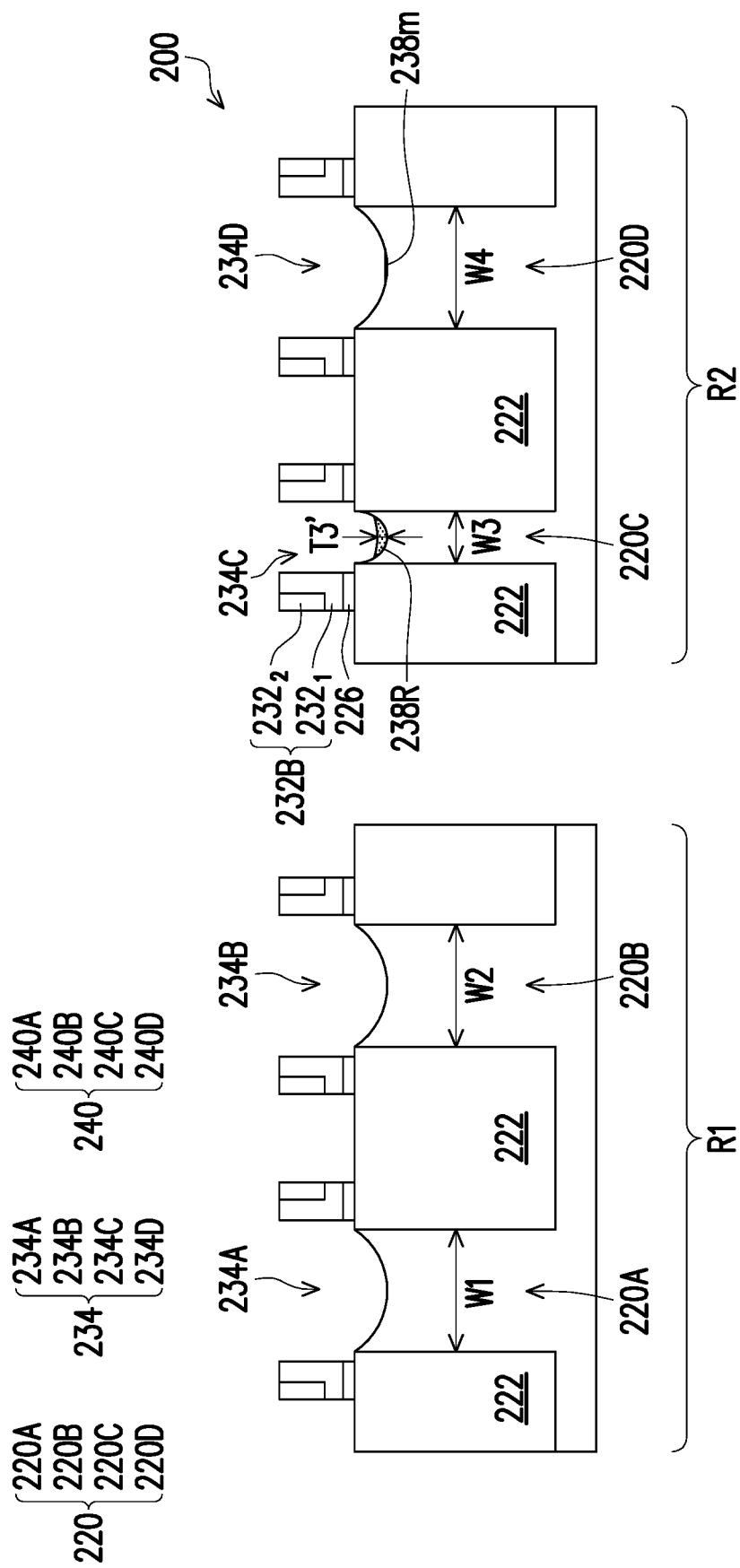

At operation S120, the method 100 (FIG. 12) partially remove the inner spacer material layer 238' to form inner spacers 238 in the cavities 236 directly under the gate sidewall spacers 232, and form residues 238R in the recesses 234C, as shown in FIGS. 8A, 8B and 8C, where FIG. 8B is a cross-sectional view along I-I', and IV-IV' lines of the GAA device 200 in FIG. 8A, and FIG. 8C is a cross-sectional view along V-V', and VI-VI' lines of the GAA device 200 in FIG. 8A. The inner spacer material layer 238' may be partially removed by an etching process. The etching process may be an anisotropic etching process such as a dry etching process. In some embodiments, the dry etching process using an etchant including a fluorine-containing gas (e.g., SF$_6$, CF$_4$, CHF$_3$, CH$_2$F$_2$, and/or C$_2$F$_6$), a chlorine-containing gas (e.g., Cl$_2$), a bromine-containing gas (e.g., HBr and/or CHBR$_3$), oxygen-containing gas (e.g., O$_2$), a helium-containing gas (e.g., He), an argon-containing gas (e.g., Ar), other suitable gases, or combinations thereof. By this etching, the inner spacer material layer 238' remains substantially within the cavities 236, because of small volumes of the cavities 236. Similarly, the inner spacer material layer 238' also remains substantially within the recesses 234C, because of a small volume of the recesses 234C and thicker inner spacer material layer 238' therein. Generally, plasma dry etching etches a layer in wide and flat areas faster than a layer in concave (e.g., holes, grooves, recesses and/or slits) portions. Thus, the inner spacer material layer 238' may remain inside the cavities 236 and also remain in the recesses 234C, while the inner spacer material layer 238' may be removed from the recesses 234A, 234B, and 234D. The remained portions of the inner spacer material layer 238' in the cavities 236 are denoted as the inner spacers 238. The remained portions of the inner spacer material layer 238' in the recesses 234C are denoted as the residues 238R. The residues 238R may also be referred to as inner spacer residues, dielectric residues, insulating residues, dielectric materials, insulators, or isolations. The residues 238R has a thickness T3' greater than 1 nm. In some embodiments, the thickness T3' of the residues 238R ranges from 3 nm to 10 nm.

The residues 238R partially covers top surfaces of the portion P2 of the fin 220C, and portions of top surfaces of the portion P2 of the fin 220C are exposed. The area covered by the residues 238R may be controlled by the parameters of etching process. In some embodiments in which the etching process is a plasma etching process, the residues 238R may be controlled by the parameters such as the etchant, the etchant flux, the etch time, the pressure, the RF coil power, the RF bias power. For example, the longer the etching process or the greater the RF bias power used for the etching process, the smaller the volume of the residues 238R and the less area covered by the residues 238R. The top surface of the portions P2 of the fin 220C exposed by the recesses 234C has an area $A_r$, and the top surface of the portions P2 of the fin 220C covered by the residues 238R has an area $A_{r'}$. A ratio of the area $A_{r'}$ to the area $A_r$ is greater than 0.001, for example. In some embodiments, the ratio of the area $A_{r'}$ to the area $A_r$ is in a range from 0.001 to 0.1. If the ratio $R_A$ is less than 0.001, the excessive performance of a pull-up transistors cannot be effectively reduced. If the ratio $R_A$ is greater than 0.1, the excessive performance of the pull-up transistors will become too weak.

In some embodiments, the inner spacer material layer 238' in the recesses 234A, 234B, or 234D is completely removed, and therefore there is no residue in the recesses 234A, 234B, or 234D. In alternative embodiments, the inner spacer material layer 238' in the recesses 234A, 234B, or 234D is not completely removed, and inner spacer residues 238m may be remained in the recesses 234A, 234B, or 234D, but the amount of these residuals 238m is much smaller than the amount of the residues 238R in the recesses 234C, or even negligible. A ratio $R_V$ of the volume of the residue 238R in one of the recesses 234C to the volume of the residuals 238m in one of the recesses 234A, 234B, or 234D is greater than 10000, or more, for example.

Figure 9A:
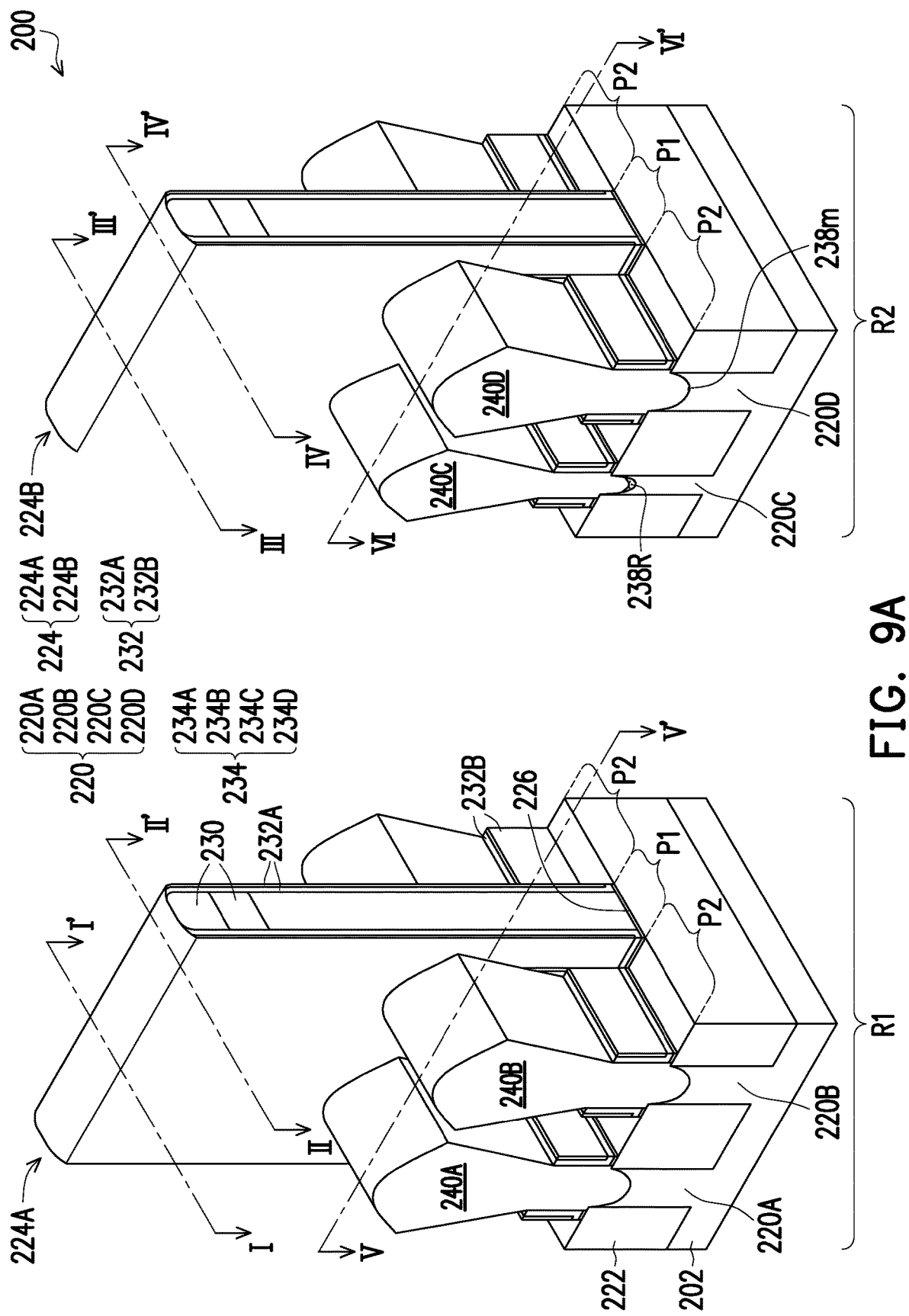
Figure 9B:
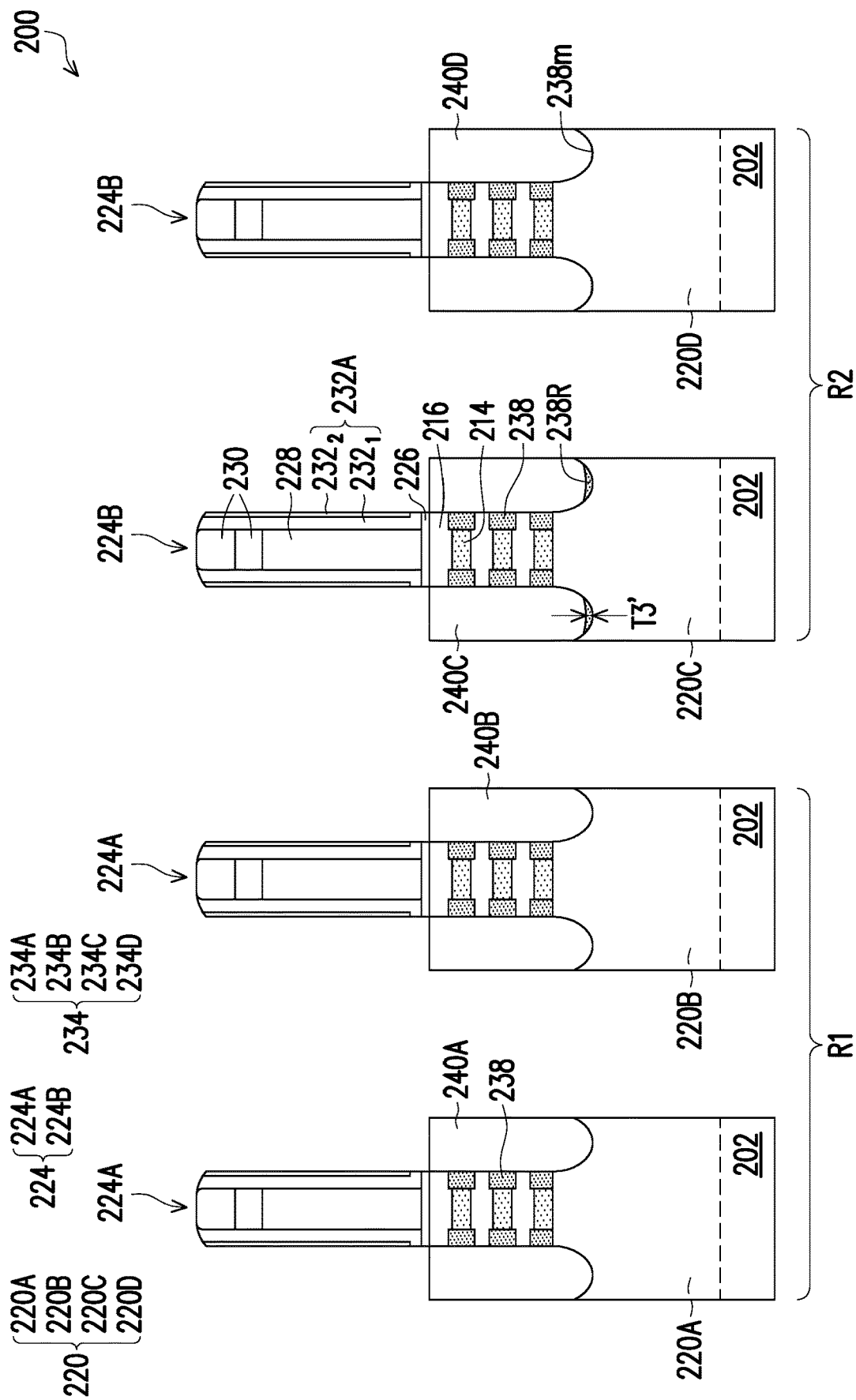
Figure 9C:
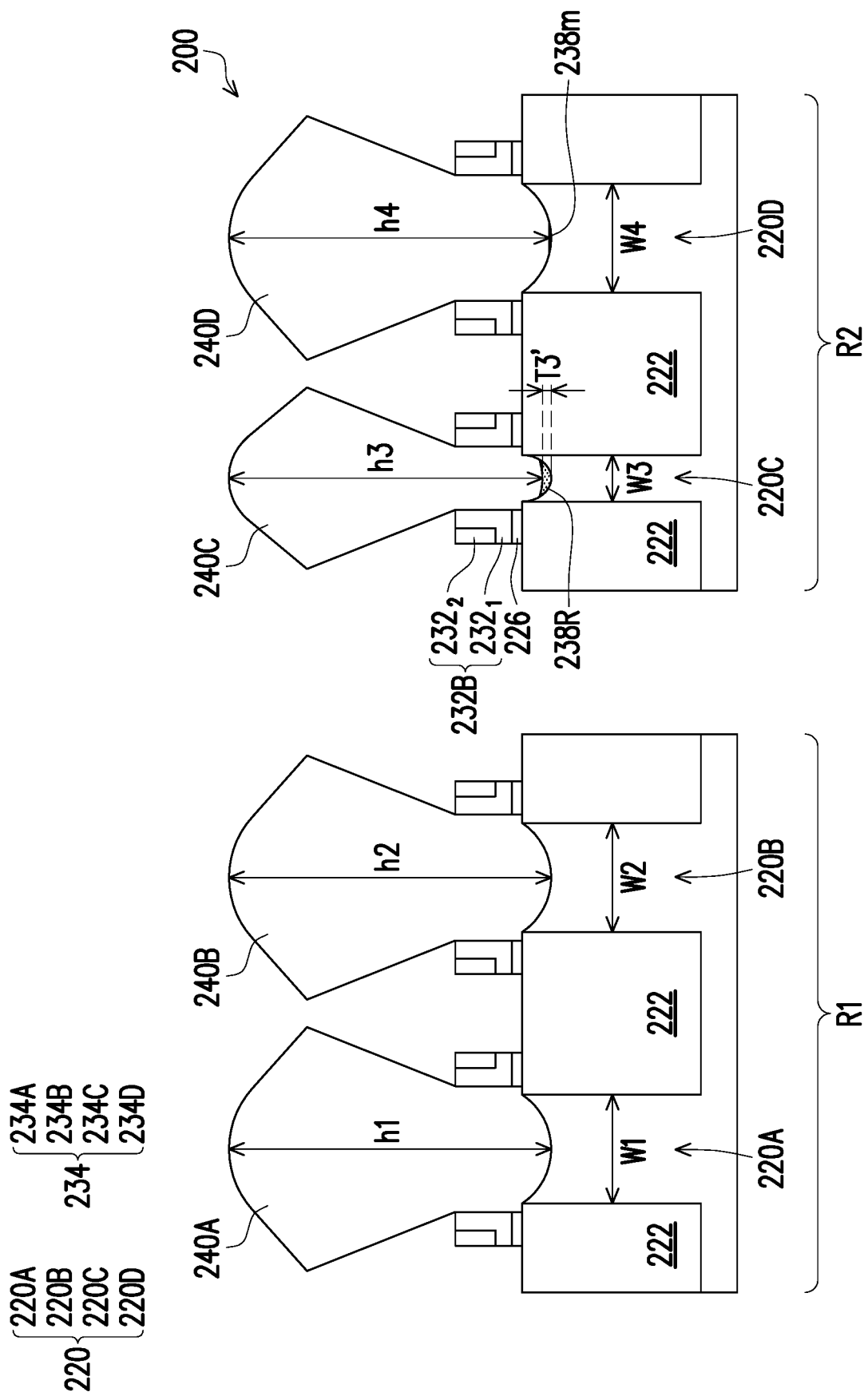

At operation S122, the method 100 (FIG. 12) forms epitaxial S/D features 240, as shown in FIGS. 9A, 9B and 9C, where FIG. 9B is a cross-sectional view along I-I', II-II', III-III' and IV-IV' lines of the GAA device 200 in FIG. 9A, and FIG. 9C is a cross-sectional view along V-V', and VI-VI' lines of the GAA device 200 in FIG. 9A. The epitaxial S/D features 240 may be formed by an epitaxial growth method using CVD, ALD or molecular beam epitaxy (MBE). The epitaxial S/D features 240 include epitaxial S/D features 240A in recesses 234A, epitaxial S/D features 240B in recesses 234B, epitaxial S/D features 240C in the recesses 234C, and epitaxial S/D features 240D in the recesses 234D. The epitaxial S/D features 240 include SiGe for p-type FETs, and silicon for n-type FETs. In some embodiments, the epitaxial S/D features 240A and 240C include SiGe for p-type FETs and may be formed at the same time, and the epitaxial S/D features 240B and 240D include silicon for n-type FETs and may be formed at the same time. Sidewalls of the epitaxial S/D features 240A, 240B, 240C and 240D are in contact with the epitaxial layers 216 of the fins 220 and the inner spacers 238. Bottoms of the epitaxial S/D features 240A, 240B, and 240D are in contact with the substrate 202 of the fins 220A, 220B and 220D, respectively, while bottoms of the epitaxial S/D features 240C are in contact with the substrate 202 of the fin 220C and the residues 238R. Since the top surfaces of the portion P2 of the fin 220C are partially covered by the residues 238R, even if the epitaxial S/D features 240C and the epitaxial S/D features 240A (or/and the epitaxial S/D features 240D) are formed at the same time, a height h3 of the epitaxial S/D features 240C is shallower than a height h1 of the epitaxial S/D features 240A. In some embodiments, the depth h3 of epitaxial S/D features 240C is shallower than the depth h1 of epitaxial S/D features 240A, and is also shallower than a depth h2 of epitaxial S/D features 240B and the depth h4 of epitaxial S/D features 240D. A different between the depth h1 and the depth h3 is greater than 1 nm, for example. In some embodiments, a different between the depth h1 and the depth h3 is in a range from 3 nm to 10 nm.

Figure 10A:
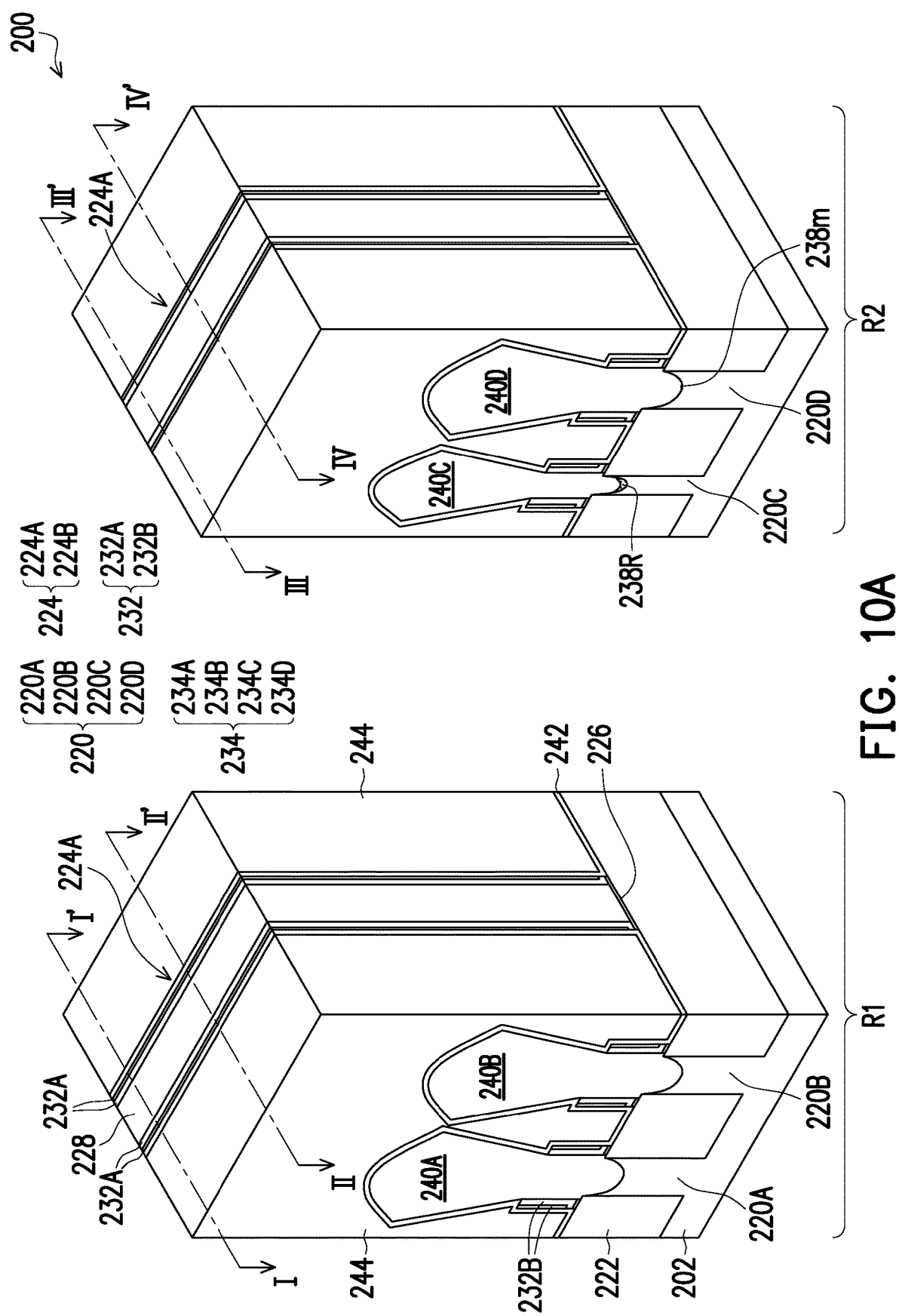
Figure 10B:
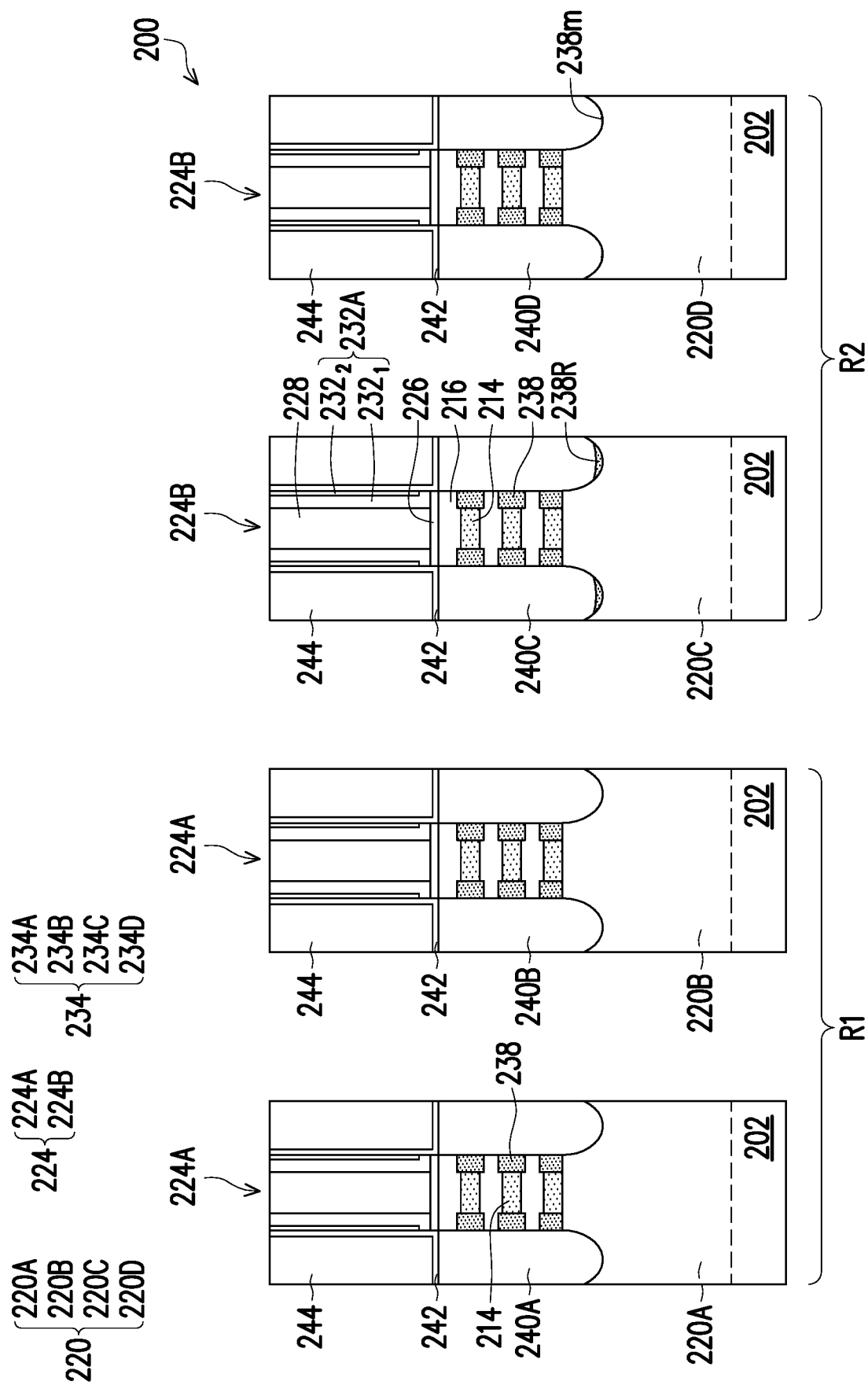

At operation S124, the method 100 (FIG. 12) forms a contact etch stop layer (CESL) 242 over the epitaxial S/D features 240 and an interlayer dielectric (ILD) layer 244 over the CESL layer 242, as shown in FIGS. 10A and 10B, where FIG. 10B is a cross-sectional view along I-I', II-II', III-III', and IV-IV' lines of the GAA device 200 in FIG. 10A. The CESL layer 242 may comprise, for example, silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. In some embodiments, forming the CESL 242 and the ILD layer 244 further includes performing a CMP process to planarize a top surface of the GAA device 200, such that the top surfaces of the sacrificial gate electrode layer 228 are exposed.

Figure 11A:
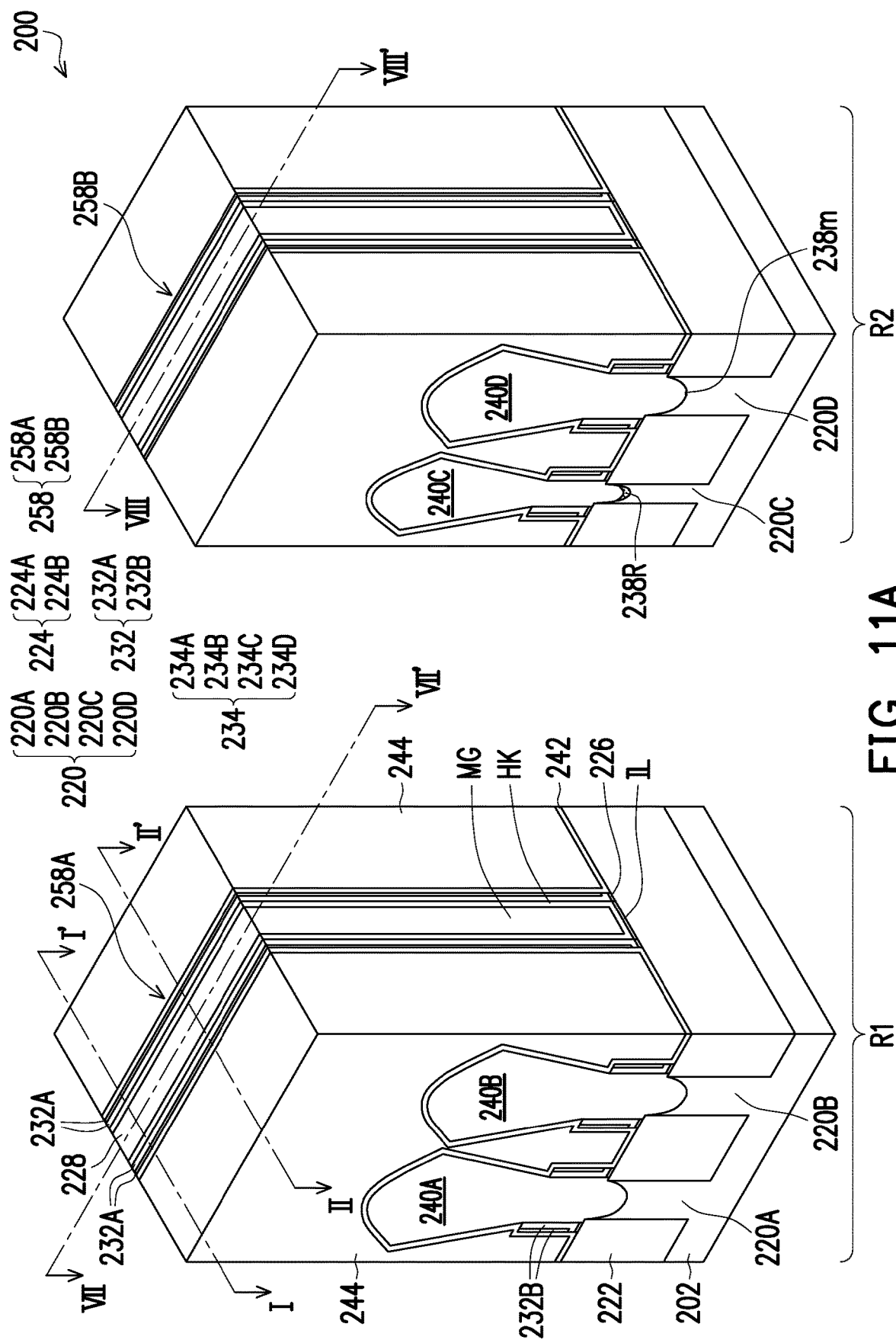
Figure 11B:
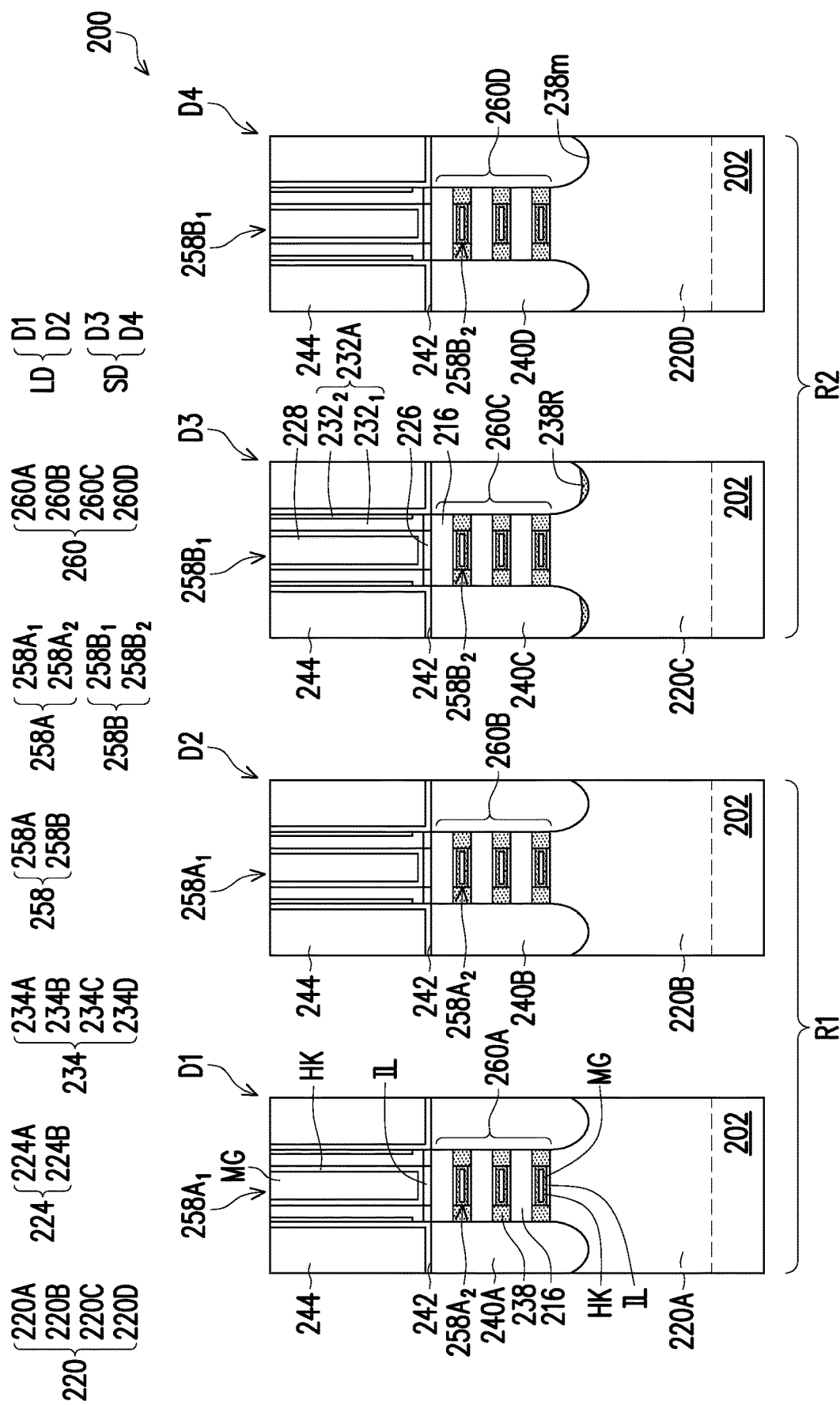
Figure 11C:
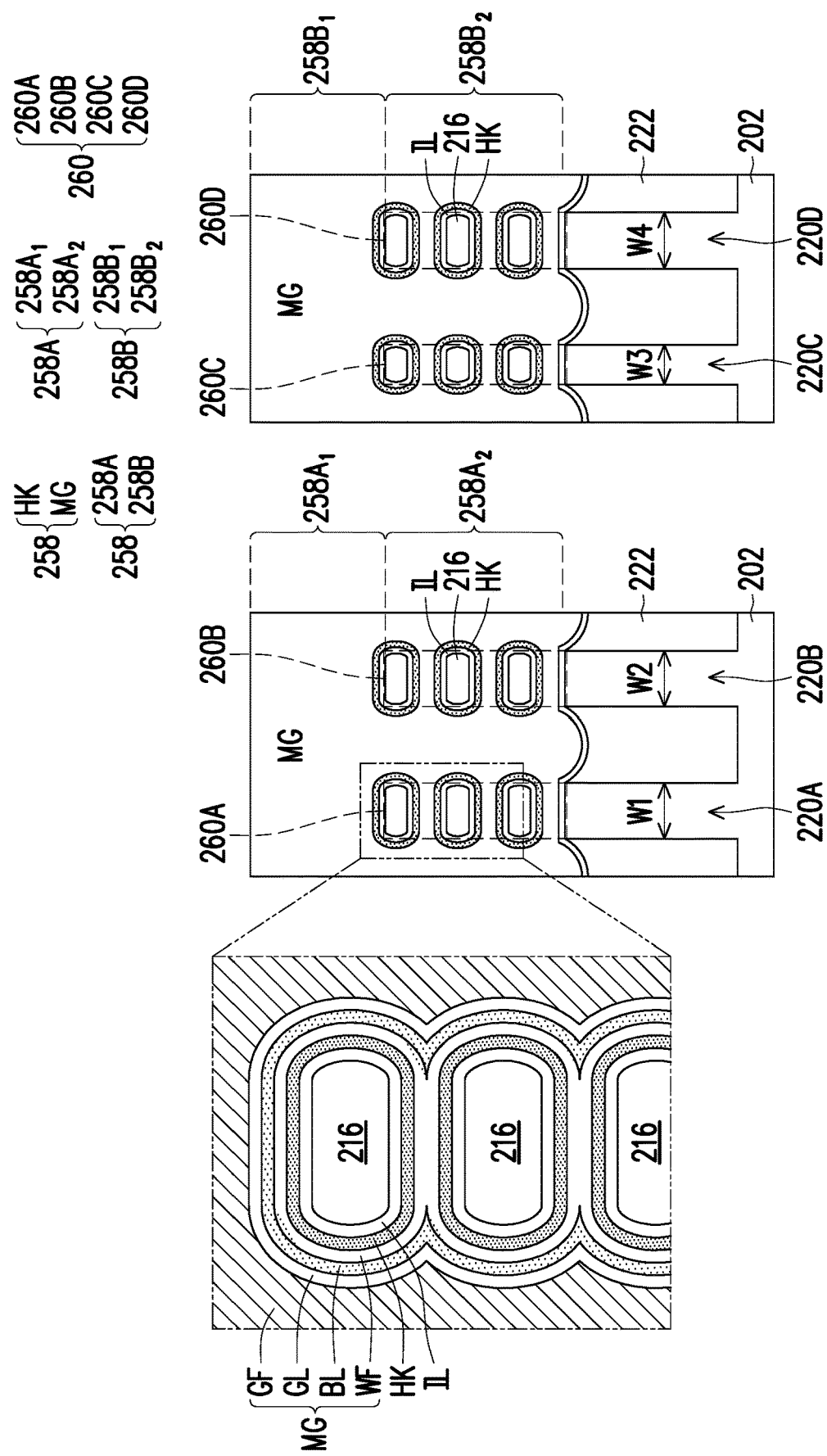
FIG. 11C are fragmentary cross-sectional views along the VII-VII' line and VIII-VIII' of the semiconductor devices 200 in FIG. 11A at other various stages of fabrication in accordance with some embodiments of the present disclosure of the method 100.

At operation S126, the method 100 (FIG. 12) removes the sacrificial gate structures 224 and the sacrificial gate dielectric layer 226 to form gate trenches (not shown), as shown in FIGS. 11A and 11B, where FIG. 11B is a cross-sectional view along I-I', II-II', III-III', and IV-IV' lines of the GAA device 200 in FIG. 11A. The ILD layer 244 and the CESL layer 242 protects the epitaxial S/D features 240 during the removal of the sacrificial gate structure 224. The sacrificial gate structure 224 may be removed using plasma dry etching and/or wet etching. When the sacrificial gate electrode layer 228 is polysilicon and the ILD layer 244 is silicon oxide, a wet etchant such as a TMAH solution may be used to selectively remove the sacrificial gate electrode layer. The sacrificial gate dielectric layer 226 is thereafter removed using plasma dry etching and/or wet etching so as to form the gate trenches (not shown) defined by the spacer 232A.

At operation S128, the method 100 (FIG. 12) releases channel members from the channel region of the GAA device 200. In the illustrated embodiment, channel members are epitaxial layers 216 in the form of nanosheets. In the present embodiment, the epitaxial layers 216 include silicon, and the epitaxial layers 214 include silicon germanium. The plurality of epitaxial layers 214 may be selectively removed. In some implementations, the selectively removal process includes oxidizing the plurality of epitaxial layers 214 using a suitable oxidizer, such as ozone. Thereafter, the oxidized epitaxial layers 214 may be selectively removed. To further this embodiment, the operation S126 includes a dry etching process to selectively remove the epitaxial layers 214, for example, by applying an HCl gas at a temperature of about 0° C. to about 150° C., or applying a gas mixture of $CF_4$, $SF_6$, $CHF_3$, HF, $NH_3$, $F_2$, $ClF_3$, $N_2$, Ar, and/or He. For the sake of simplicity and clarity, after operation S128, the epitaxial layers 216 are denoted as nanosheets 216. At this point, as shown in FIG. 11A, vertically stacked nanosheets 216 are formed in the channel regions of GAA device.

At operation S130, the method 100 (FIG. 12) forms metal gate structures (or referred to as a gate stack) 258 engaging the nanosheets 216 in the channel region, as shown in FIGS. 11A, 11B, and 11C, where FIG. 11B is a cross-sectional view along I-I', II-II', III-III', and IV-IV' lines of the GAA device 200 in FIG. 11A, FIG. 11C is a cross-sectional view along VII-VII' and VIII-VIII' lines of the GAA device 200 in FIG. 11A.

The metal gate structure 258 may include a high-k layer HK disposed on an insulating layer IL, and a metal gate electrode MG on the high-k layer HK. The high-k layer HK and the metal gate electrode MG are form to wrap each nanosheet 216 in the channel region. The inner spacers 238 separate the metal gate electrode MG from the epitaxial S/D features 240. The metal gate electrode MG includes a work function layer WF, a barrier layer BL, a glue layer GL, and a gate fill material GF sequentially on the high-k layer HK in some embodiments. Each of the high-k layer HK, the work function layer WF, the glue layer GL, and the gate fill material GF may be deposited by using physical vapor deposition (PVD), molecular-beam deposition (MBD), atomic layer deposition (ALD), chemical vapor deposition (CVD), sputtering, or other known processes, depending on the material composition of the layer.

The insulating layer IL is formed to wrap each nanosheet 216 in the channel region. The insulating layer IL may be deposited or thermally grown respectively on the nanosheet 216 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The thickness of the insulating layer IL is in a range from about 0.7 nm to about 2.5 nm in some embodiments.

The high-k layer (or referred to as a gate dielectric layer) HK is formed on the insulating layer IL. The formation methods of the high-k layer HK may include molecular-beam deposition (MBD), ALD, PECVD, and the like. The high-k layer may have a dielectric constant greater than, for example, about 3.9 (the dielectric constant of silicon dioxide) or greater than about 7.0, and be made of, but not limited to, a metal oxide or a silicate of Hf, Al, Zr, La, Mg, Ba, Ti, Pb, and combinations thereof. Alternatively, the high-k layer HK may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$(BTO), BaZrO, HfZrO, HfLaO, HfSiO, LaSiO, AlSiO, HfTaO, HfTiO, (Ba,Sr)$TiO_3$(BST), $Al_2O_3$, $Si_3N_4$, oxynitrides (SiON), combinations thereof, or other suitable material.

The work function layer WF is formed on each high-k layer HK surrounding each nanosheet 216 in the channel region. The work function layer WF is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, TiAlC, HfTi, TiSi and TaSi is used as the work function adjustment layer, and for the p-channel FET, one or more of TiAlC, Al, TiAl, TaN, TaAlC, TiN, TiC and Co is used as the work function layer. The work function layers WF may be formed by ALD, PVD, CVD, e-beam evaporation, or other suitable process. Further, the work function layer WF may be formed separately for the n-channel FET and the p-channel FET which may use different metal layers.

The barrier layer BL is formed on each work function layer WF. The barrier layer BL is made of a conductive material including a single layer or a multilayer. In some embodiments in which the work function layer WF includes a single layer or a multilayer and the single layer or a most outer layer of the multilayer includes a non-nitride material such as TaAlC, TiC, TaC, Co, Al, TiAl, HfTi, TiSi, TaSi or TiAlC, the barrier layer BL includes a nitride of metal such as TiN, TaN, or Si-doped TiN (TSN), of two or more of these materials. The barrier layer BL may be formed by ALD, PVD, CVD, e-beam evaporation, or other suitable process. The thickness of the barrier layer BL is in a range from about 5 nm to about 30 nm in some embodiments.

The glue layer GL is formed on each barrier layer BL, and the gate fill material GF is formed on the glue layer GL. The glue layer GL may include TiN or similar material. In some embodiments, the material of the glue layer GL may have desirable affinity to the material of the gate fill material GF, such that the gate fill material GF may be firmly adhered to the glue layer GL. The gate fill material GF disposed on the glue layer GL1 may be formed by a conductive material such as W, TiN, TaN, WN, Re, Ir, Ru, Mo, Al, Cu, Co, Ni, combinations thereof, and/or other suitable compositions.

The high-k layer HK, the work function layer WF, the barrier layer BL, the glue layer GL, and the gate fill material GF may also be deposited over the upper surfaces of the ILD layer 244 and the CESL layer 242. The high-k layer HK, the work function layer WF, the barrier layer BL, the glue layer GL, and the gate fill material GF formed over the ILD layer 244 and the CESL layer 242 are then planarized by using, for example, CMP, until the top surfaces of the ILD layer 244 and the CESL layer 242 is revealed. In some embodiments, after the planarization operation, the metal gate electrode MG is recessed and a cap insulating layer (not shown) is formed over the recessed metal gate electrode MG. The cap insulating layer includes one or more layers of a silicon nitride-based material, such as SiN. The cap insulating layer may be formed by depositing an insulating material followed by a planarization operation.

In some embodiments, the metal gate structure 258 includes metal gate structures 258A and metal gate structures 258B. The metal gate structures 258A are formed in region R1. The metal gate structure 258A includes a metal gate structure 258A$_1$ and metal gate structures 258A$_2$. The metal gate structure 258A$_1$ fill in the gate trenches (not shown) defined by the spacer 232A, and the metal gate structures 258A$_2$ fill in the spaces (not shown) between the nanosheets 216. The metal gate structures 258A$_2$ and the epitaxial S/D features 240A, or the metal gate structures 258A$_2$ and the epitaxial S/D features 240B are separated by the inner spacer 238. The metal gate structures 258A$_2$, the nanosheets 216 and the inner spacer 238 form nanosheet stacks 260A and 260B. The metal gate structure 258A$_1$, the nanosheet stack 260A, and the epitaxial S/D features 240A form a device D1, and the metal gate structure 258A$_1$, the nanosheet stack 260B, and the epitaxial S/D features 240B form a device D2. In some embodiments, the device D1 is a PMOS transistor of a logic device LD, and the device D2 is a NMOS transistor of the logic device LD.

The metal gate structures 258B are formed in region R2. The metal gate structure 258B includes a metal gate structure 258B$_1$ and metal gate structures 258B$_2$. The metal gate structure 258B$_1$ fill in the gate trenches (not shown) defined by the spacer 232A, and the metal gate structures 258B$_2$ fill in the spaces (not shown) between the nanosheets 216. The metal gate structures 258B$_2$ and the epitaxial S/D features 240C or the metal gate structures 258B$_2$ and the epitaxial S/D features 240D are separated by the inner spacer 238. The metal gate structures 258B$_2$, the nanosheets 216, and the inner spacer 238 form nanosheet stacks 260C and 260D. The metal gate structure 258B$_1$, the nanosheet stack 260C, and the epitaxial S/D features 240C form a device D3, and the metal gate structure 258B$_1$, the nanosheet stack 260D, and the epitaxial S/D features 240D form a device D4. In some embodiments, the device D3 is a PMOS transistor as a pull-up transistor of a SRAM device (or referred to as a SRAM cell) SD, and the device D4 is a NMOS transistor as a pull-down transistor of the SRAM device SD. In alternative embodiments, the device D3 is a PMOS transistor as a PU transistor of a SRAM device SD, and the device D4 is a NMOS as a pass-gate (PG) transistor of the SRAM device SD.

In accordance with the present disclosure, the device (e.g., PU transistor) D3 further include inner spacer residues 238R between the epitaxial S/D features 240C and the fin 220C. Since the residues 238R covers the portions of the fin 220C in the S/D regions, the epitaxial S/D features 240C of the device (e.g., PU transistor) D3 has the depth h3 shallower than the depth h1 of the epitaxial S/D features 240A of the device D1 (e.g., PMOS transistor) and the depth h2 of the epitaxial S/D features 240B of the device D1 (e.g., NMOS transistor) of the logic device, and shallower than the depth h4 of the epitaxial S/D features 240D of the device D4 (e.g., the PD transistor or the PG transistor) of the SRAM device.

In accordance with the present disclosure, the epitaxial S/D features of the pull-up (PU) transistor has the shallower depth by remaining the inner spacer residues on the fin, and therefore, the excessive performance of the pull-up (PU) transistors in the SRAM device may be decreased while the performances of the PMOS transistor and the NMOS transistor of the logic device are maintained. Furthermore, the depth of epitaxial S/D features of the pull-up transistor can be tuned by the amount of inner spacer residues, and then the alpha ratio ($\alpha=I_{sat\_PU}/I_{sat\_PG}$)) can be adjusted to improve read/write tolerance of the SRAM device, wherein the $I_{sat\_PU}$ represents the saturation current of the PU transistor, and the $I_{sat\_PG}$ represents the saturation current of the PG transistor.

In accordance with some embodiments of the disclosure, a SRAM cell comprising a pull-up device, comprising a plurality of first epitaxial source and drain (S/D) features on a first fin, and a plurality of first residues between the plurality of first epitaxial source and drain (S/D) features and the first fin; and a pull-down device, comprising a plurality of second epitaxial S/D features on a second fin.

In accordance with other some embodiments of the disclosure, semiconductor device, comprising: a SRAM device and a logic device. The SRAM device comprises a first PMOS transistor as a pull-up transistor including a plurality of first epitaxial S/D features on a first fin, and a plurality of first dielectric materials between the plurality of first epitaxial S/D features and the first fin. The logic device comprises a second PMOS transistor including a plurality of second epitaxial S/D features on a second fin.

In accordance with alternative embodiments of the disclosure, a method of fabricating a semiconductor device comprising: forming a first PMOS device as a pull-up device of a SRAM device, comprising: forming a first nanosheet stack on a first portion of a first fin; forming a plurality of first residues on a plurality of second portions of the first fin beside the first nanosheet stack; and forming a plurality of first epitaxial S/D features on and in contact with the plurality of second portions of the first fin and the plurality of first residues.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A SRAM cell, comprising:
a pull-up device, comprising a plurality of first epitaxial source and drain (S/D) features on a first fin, and a plurality of first residues between the plurality of first epitaxial source and drain (S/D) features and the first fin; and
a pull-down device, comprising a plurality of second epitaxial S/D features on a second fin,
wherein the plurality of first epitaxial S/D features has a first depth, the plurality of second epitaxial S/D features has a second depth, and the first depth is less than the second depth.

2. The SRAM cell of claim 1, wherein the pull-up device is a PMOS device, and the pull-down device is a NMOS device.

3. The SRAM cell of claim 1, wherein the plurality of first residues are in contact with the plurality of first epitaxial S/D features and the first fin.

4. The SRAM cell of claim 1, wherein the plurality of first residues comprises a dielectric material.

5. The SRAM cell of claim 1, wherein the further comprising:

a nanosheet stack on the first fin and between the plurality of first epitaxial S/D features, wherein the nanosheet stack comprises:
a plurality of metal gate structures;
a plurality of nanosheets interposed between the plurality of metal gate structures; and
a plurality of inner spacers located at ends of the plurality of nanosheets,
wherein the plurality of metal gate structures and the plurality of first epitaxial S/D features are separated by the plurality of inner spacer, and the plurality first residue and the plurality of inner spacers have a same material.

6. The SRAM cell of claim 1, wherein the pull-down device further comprises a plurality of second residue between the plurality of second epitaxial S/D features and the second fin, and the amount of the plurality of first residues is greater than the amount of the plurality of second residues.

7. The SRAM cell of claim 1, wherein the pull-down device is free of a residue between the plurality of second epitaxial S/D features and the second fin.

8. The SRAM cell of claim 1, wherein the first fin has a first width, the second fin has a second width, and the first width is less than the second width.

9. The SRAM cell of claim 1, wherein a plurality of portion of the first epitaxial S/D features are in contact with the first fin.

10. A semiconductor device, comprising:
a SRAM device, comprising:
a first PMOS transistor as a pull-up transistor, comprising a plurality of first epitaxial S/D features on a first fin, and a plurality of first dielectric materials between the plurality of first epitaxial S/D features and the first fin; and
a logic device, comprising:
a second PMOS transistor, comprising a plurality of second epitaxial S/D features on a second fin,
wherein the first fin has a first width, the second fin has a second width, and the first width is less than the second width.

11. The semiconductor device of claim 10, wherein the plurality of first epitaxial S/D features has a first depth, the plurality of second epitaxial S/D features has a second depth, and the first depth is less than the second depth.

12. The semiconductor device of claim 11, wherein the SRAM device further comprises a first NMOS transistor as a pull-down transistor, wherein the first NMOS transistor comprises a plurality of third epitaxial S/D features having a third depth greater than the first depth.

13. The semiconductor device of claim 12, wherein the logic device further comprises a second NMOS transistor, wherein the second NMOS transistor comprises a plurality of fourth epitaxial S/D features having a fourth depth greater than the first depth.

14. The semiconductor device of claim 13, wherein the SRAM device further comprises:
a third NMOS transistor as a pass-gate transistor, wherein the third PMOS transistor comprises a plurality of fifth epitaxial S/D features having a fifth depth greater than the first depth.

15. The semiconductor device of claim 10, wherein the plurality of first dielectric materials comprises silicon oxides, silicon nitrides, silicon carbides, silicon carbide nitride, silicon oxide carbide, silicon carbide oxynitride, or a combination thereof.

16. The semiconductor device of claim 10, wherein
the second PMOS transistor is free of a dielectric material between the plurality of second epitaxial S/D features and the second fin, or
the second PMOS transistor further comprises second residues between the plurality of second epitaxial S/D features and the second fin, and the amount of the plurality of first dielectric materials is greater than the amount of the second dielectric materials.

17. The semiconductor device of claim 10, wherein a plurality of portions of the first epitaxial S/D features are in contact with the first tin.

18. A method of fabricating a semiconductor device, comprising:
forming a first PMOS device as a pull-up device of a SRAM device, comprising:
forming a first nanosheet stack on a first portion of a first fin;
forming a plurality of first residues on a plurality of second portions of the first fin beside the first nanosheet stack; and
forming a plurality of first epitaxial S/D features on and in contact with the plurality of second portions of the first fin and the plurality of first residues; and
forming a first NMOS device of the SRAM device, comprising:
forming a second nanosheet stack on a first portion of a second fin;
removing a plurality of second residues on a plurality of second portions of the second fin beside the second nanosheet stack; and
forming a plurality of second epitaxial S/D features on and in contact with the plurality of second portions of the second fin.

19. The method of claim 18, further comprising:
forming a second PMOS device of a logic device, comprising:
forming a third nanosheet stack on a first portion of a third fin;
removing a plurality of third residues on a plurality of second portions of the third fin beside the third nanosheet stack; and
forming a plurality of third epitaxial S/D features on and in contact with the plurality of second portions of the third fin.

20. The method of claim 19, further comprising:
forming a second NPMOS device of a logic device, comprising:
forming a fourth nanosheet stack on a first portion of a fourth fin;
removing a plurality of fourth residues on a plurality of second portions of the fourth fin beside the fourth nanosheet stack; and
forming a plurality of fourth epitaxial S/D features on and in contact with the plurality of second portions of the fourth fin.

* * * * *